United States Patent
Gao et al.

(10) Patent No.: US 12,217,204 B2
(45) Date of Patent: Feb. 4, 2025

(54) INTELLIGENT MULTI-POLLUTANT ULTRA-LOW EMISSION SYSTEM AND GLOBAL OPTIMIZATION METHOD THEREOF

(71) Applicant: ZHEJIANG UNIVERSITY, Hangzhou (CN)

(72) Inventors: Xiang Gao, Hangzhou (CN); Chenghang Zheng, Hangzhou (CN); Yueqi Huang, Hangzhou (CN); Yishan Guo, Hangzhou (CN); Yongxin Zhang, Hangzhou (CN); Weiguo Weng, Hangzhou (CN); Weihong Wu, Hangzhou (CN); Ruiyang Qu, Hangzhou (CN); Shaojun Liu, Hangzhou (CN); Haitao Zhao, Hangzhou (CN)

(73) Assignee: ZHEJIANG UNIVERSITY, Hangzhou (CN)

(*) Notice: Subject to any disclaimer, the term of this patent is extended or adjusted under 35 U.S.C. 154(b) by 1014 days.

(21) Appl. No.: 17/263,869

(22) PCT Filed: Oct. 30, 2019

(86) PCT No.: PCT/CN2019/114203
§ 371 (c)(1),
(2) Date: Jan. 27, 2021

(87) PCT Pub. No.: WO2020/088485
PCT Pub. Date: May 7, 2020

(65) Prior Publication Data
US 2021/0319373 A1    Oct. 14, 2021

(30) Foreign Application Priority Data
Nov. 2, 2018  (CN) .......................... 201811300698.3

(51) Int. Cl.
*G06Q 10/0633* (2023.01)
*B01D 53/60* (2006.01)
(Continued)

(52) U.S. Cl.
CPC ......... *G06Q 10/0633* (2013.01); *B01D 53/60* (2013.01); *B01D 53/64* (2013.01);
(Continued)

(58) Field of Classification Search
None
See application file for complete search history.

(56) References Cited

U.S. PATENT DOCUMENTS 7,599,750 B2 * 10/2009 Piche ........................ H02J 3/38
700/286

FOREIGN PATENT DOCUMENTS

CN          104504498         4/2015

OTHER PUBLICATIONS

Lockwood ("Advanced sensors and smart controls for coal-fired power plant" IEA Clean Coal Centre (2015), pp. 1-104). (Year: 2015).*

(Continued)

*Primary Examiner* — Michael Forrest
(74) *Attorney, Agent, or Firm* — Jiwen Chen; Joywin IP Law PLLC

(57) ABSTRACT

The invention relates to an intelligent multi-pollutant ultra-low emission system and a global optimization method thereof. The intelligent multi-pollutant ultra-low emission system comprises a device layer, a sensing layer, a control layer and an optimization layer from bottom to top. The global optimization method comprises: obtaining an accurate description multiple pollutants in the generation, migration, transformation and removal process in multiple devices by means of accurate modeling of a multi-device multi- (Continued)

pollutant simultaneous removal process of the ultra-low emission system; accurately evaluating multi-pollutant emission reduction costs under different loads, coal qualities, pollutant concentrations and operating parameters through a global operating cost evaluation method of the ultra-low emission system; realizing minute-level planning and optimization of emission reductions of a global pollutant emission reduction device under different emission targets through a multi-pollutant, multi-target and multi-condition global operating optimization method; and guaranteeing reliable emission reduction and margin control of the pollutants through an advanced control method for reliable up-to-standard ultra-low emission of the pollutants.

5 Claims, 7 Drawing Sheets

(51) Int. Cl.
*B01D 53/64* (2006.01)
*B01D 53/75* (2006.01)
*G06F 30/20* (2020.01)
*G06Q 10/0631* (2023.01)

(52) U.S. Cl.
CPC ............ *B01D 53/75* (2013.01); *G06F 30/20* (2020.01); *G06Q 10/0631* (2013.01); *B01D 2257/302* (2013.01); *B01D 2258/0283* (2013.01)

(56) References Cited

OTHER PUBLICATIONS

Xu Zhewei, Study on Operating Optimization of Coal-fired Unit Ultra Low Emission System, Chinese Master's Theses Full-Text Database, Engineering Science and Technology I, No. 2018, 06, Jun. 15, 2018, pp. 1-70.

* cited by examiner

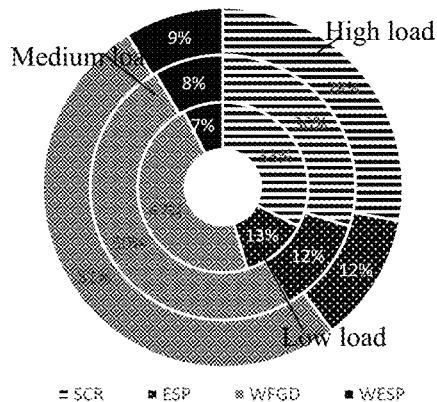
Fig. 7 (a) low pollutant concentration
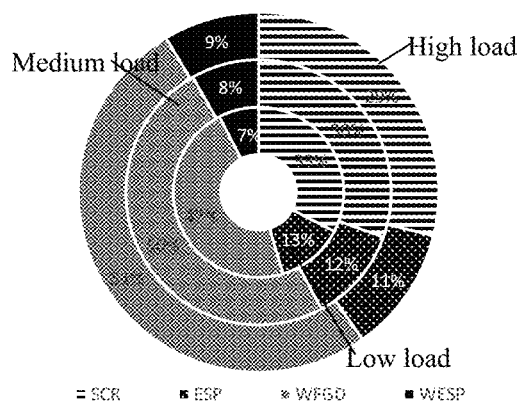
Fig. 7 (b) medium pollutant concentration
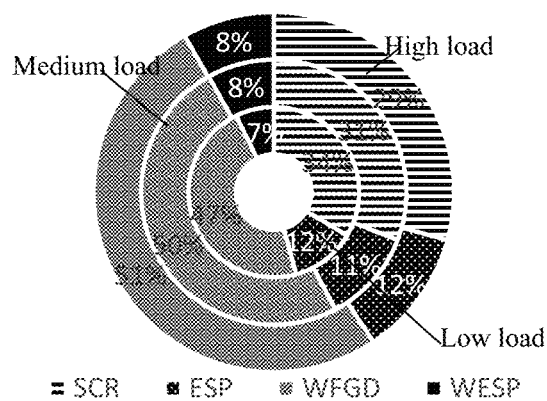
Fig. 7 (c) high pollutant concentration

INTELLIGENT MULTI-POLLUTANT ULTRA-LOW EMISSION SYSTEM AND GLOBAL OPTIMIZATION METHOD THEREOF This is a U.S. national stage application of PCT Application No. PCT/CN2019/114203 under 35 U.S.C. 371, filed Oct. 30, 2019 in Chinese, claiming priority to Chinese Patent Application No. 201811300698.3, filed Nov. 2, 2018, all of which are hereby incorporated by reference.

BACKGROUND OF THE INVENTION

1. Technical Field

The invention belongs to the technical field of control of pollution reduction devices for energy and environment engineering, and particularly relates to an intelligent multi-pollutant ultra-low emission system and global optimization method thereof.

2. Description of Related Art

Ultra-low emission systems, as primary flue gas purification systems for coal-fired flue gas pollution sources in coal-fired power plants in China, typically comprise a series of pollutant emission reduction devices for desulfurization, denitration and precipitation. Generally, the operation of pollutant control facilities in the ultra-low emission system is controlled and optimized manually in a pyramid manner; the pollutant control facilities operate separately and cannot form a multi-pollutant simultaneous removal system, which makes it difficult to realize optimal control of simultaneous treatment of pollutants and causes the problems of repeated system construction, high power consumption, failure to reach the standard and waste of energy and resources. With the rapid promotion of ultra-low emission transformation in China, ultra-low emission system up to ultra-low emission standards have been established in most coal-fired power plants. However, to reach the higher emission standards, the environmentally-friendly facilities have to consume more materials and energy to improve the pollutant emission reduction efficiency, which in turn leads to a higher cost. Moreover, because the multi-pollutant control process of the ultra-low emission system is dynamic, the operating characteristics of the systems may change due to frequent variations of generation loads and frequent fluctuations of coal components, and existing operating manners based on workers' experience cannot realize accurate regulation and optimal control of the systems when the operating conditions change. To adapt to variable pollutant concentrations, realize energy conservation and consumption reduction, improve the emission stability and reduce environmental pollutants and resource consumption, full-course optimal control of the ultra-low emission systems in the control process is necessary. In view of this, it is imperative to develop an intelligent multi-pollutant ultra-low emission system suitable for China's national situation and a global optimization method thereof to improve the operating economy, stability and reliability of the multi-pollutant simultaneous removal systems.

BRIEF SUMMARY OF THE INVENTION

The object of the present invention is to solve the problems of mutual independence, great operating fluctuations and high pollutant removal costs of pollutant removal facilities of existing ultra-low emission systems by providing an intelligent multi-pollutant ultra-low emission system and a global optimization method thereof. The present invention makes innovations to modeling, optimization and control methods of ultra-low emission systems in the aspect of models, architectures and algorithms and overcomes the difficulties of modeling and cost evaluation of multi-condition, multi-pollutant, multi-device and multi-parameter complicated systems, multi-target optimization and large delay of multi-input multi-output devices and control of nonlinear wide-range load-variable devices, thus improving the controllability and adjustability of the system and having a guiding significance in efficient, reliable and economical operation of ultra-low emission systems.

To fulfill the aforesaid object, the present invention provides an intelligent multi-pollutant ultra-low emission system which is of a four-layer structure and comprises a device layer, a sensing layer, a control layer and an optimization layer from bottom to top.

The device layer comprises multiple key devices of the ultra-low emission system, including a desulfurization device, a denitration device and precipitators, and realizes efficient removal of pollutants through a series of physical and chemical reactions.

The sensing layer is an information hub or center of the intelligent multi-pollutant ultra-low emission system and is used for acquiring, preprocessing, integrating, storing and issuing information by means of a pollutants online detection device, a distributed control system and other sensing and communication systems.

The control layer is an important intermediate layer for controlling key manipulated variables according to real-time operating conditions and optimized parameter settings to guarantee stable up-to-standard operation and optimal regulation of the system.

The optimization layer is a key layer for realizing efficient simultaneous removal of multiple pollutants in the intelligent multi-pollutant ultra-low emission system, fulfills optimization of global set points by establishing an optimization model, a prediction model and a cost evaluation model, and has the functions of balancing emission reductions of all devices and optimizing global material and energy distributions of the ultra-low emission system.

In the ultra-low emission system, a control information flow flows from top to bottom, and a feedback information flow flows from bottom to top.

Preferably, information flows of the sensing layer, the control layer and the optimization layer adopt different time scales which are t, t* and t**, respectively. Wherein, t represents a real-time scale mainly used for online monitoring and local control, t* represents a second scale (also referred to as control scale) mainly used for reception and feedback of second-level signals of the control layer, and t** represents a minute scale or a superior scale (also referred to as global scale) mainly used for instruction optimization and allocation of the optimization layer.

The device layer is a control object of the intelligent multi-pollutant ultra-low emission system. A primary input of the device layer is a control vector (real-time scale) $\vec{u}_d^t$, and outputs of the device layer are $\vec{u}_d^{fb,t}, \vec{v}_d^t \vec{y}_d^t$ to be acquired by the sensing layer.

Primary information received by the sensing layer includes a manipulated variable feedback vector (real-time scale) $\vec{u}_d^{fb,t}$, an operating disturbance vector (real-time scale)

$\vec{v}_d^t$, an operating target vector (real-time scale) $\overrightarrow{u_d^{fb,t}}$, and a control variable setting vector (control scale) $\overrightarrow{u_d^{sp,t^*}}$, and primary information output by the sensing layer is a control vector (real-time scale) $\vec{u}_d^t$.

Different from the optimization layer which adopts a model-based architecture, the control layer is used for actual control of the devices of the ultra-low emission system according to online monitoring and feedback states of a real-time condition, has a high regulating frequency, adopts a second time scale and a device-level spatial scale for key pollutant removal devices. Primary information received by the control layer includes a manipulated variable feedback vector (control scale) $\overrightarrow{u_d^{fb,t^*}}$, an operating disturbance vector (control scale) $\overrightarrow{v_d^{t^*}}$, an operating target vector (control scale) $\overrightarrow{y_d^{t^*}}$ and an optimization target vector (global scale) $\overrightarrow{y_p^{sp,t^{**}}}$; primary information output by the control layer is a control variable setting vector (control scale) $\overrightarrow{u_d^{sp,t^*}}$.

Primary information received by the optimization layer includes an operating target setting vector $\overrightarrow{sp_p^y}$, an operating constraint vector $\overrightarrow{u_p^r}$, an operating disturbance vector (global scale) $\overrightarrow{v_p^{t^{}}}$ and an operating manipulation vector (global vector) $\overrightarrow{u_p^{t^{}}}$; primary information output by the optimization layer is an optimization target vector (global vector) $\overrightarrow{y_p^{sp,t^{**}}}$.

With the denitration device, the desulfurization device and the precipitation device of the intelligent multi-pollutant ultra-low emission system as major control objects, an optimal simultaneous emission-reduction configuration for multiple pollutants is resolved under the precondition where the total emission is closest to a target and a manipulated variable is reasonable:

$$\max_y \min_u J(y, u, v) = \int_0^T F(y, u, v) dt$$

wherein, F(y, u, v) is a function for describing the variation of a cost with an outlet concentration, the manipulated variable and a disturbance variable.

Among all the layers, data flows issued by the optimization layer and the control layer are generated and transmitted as follows:

$$\overrightarrow{y_p^{sp,t^{}}} = f_{opt,p}\left(\overrightarrow{sp_p^y}, \overrightarrow{u_p^r}, \overrightarrow{v_p^{t^{}}}, \overrightarrow{u_p^{t^{**}}}\right)$$

$$\overrightarrow{u_d^{sp,t^*}} = f_{con,d}\left(\overrightarrow{u_d^{fb,t^*}}, \overrightarrow{v_d^{t^*}}, \overrightarrow{y_d^{t^*}}, \overrightarrow{y_p^{sp,t^{**}}}\right)$$

$$\overrightarrow{u_d^t} = f_{comm,d}(\overrightarrow{u_d^{fb,t^*}})$$

wherein,
$f_{opt,p}()$ is a global optimization function;
$f_{con,d}()$ is a control function of the devices;
$f_{comm,d}()$ is a communication logic function of the sensing layer.

A global optimization method of the intelligent multi-pollutant ultra-low emission system comprises: obtaining an accurate description of multiple pollutants in the generation, migration, transformation and removal process in multiple devices by means of accurate modeling of a multi-device multi-pollutant simultaneous removal process of the ultra-low emission system; accurately evaluating multi-pollutant emission reduction costs under different loads, coal qualities, pollutant concentrations and operating parameters through a global operating cost evaluation method of the ultra-low emission system; realizing minute-level planning and optimization of emission reductions of a global pollutant emission reduction device under different emission targets through a multi-pollutant, multi-target and multi-condition global operating optimization method; and guaranteeing reliable emission reduction and margin control of the pollutants through an advanced control method for reliable up-to-standard ultra-low emission of the pollutants.

Preferably, accurate modeling of the multi-device multi-pollutant simultaneous removal process of the ultra-low emission system includes accurate prediction of a multi-pollutant generation process, accurate modeling of a multi-pollutant simultaneous removal process of a desulfurization system, accurate modeling of a multi-pollutant simultaneous removal and transformation process of a denitration system, and accurate modeling of a multi-pollutant removal process of a precipitation system;

Accurate prediction of the multi-pollutant generation process: a boiler operating database and a multi-pollutant outlet concentration database under different conditions and variable coal qualities are established by acquiring long-term operating data of a boiler and a continuous emission monitoring system (CEMS) are acquired and combining the long-term operating data of the CEMS, coal quality detection data and test reports of multiple pollutants including $NO_x$, $SO_2$, $SO_3$, PM and Hg; and a model for describing a corresponding relationship of boiler parameters and coal quality parameters with the concentrations of the pollutants at a boiler outlet under different coal qualities and loads is established based on the boiler operating database and the multi-pollutant outlet concentration database through a data modeling method.

Accurate modeling of the multi-pollutant simultaneous removal process of the desulfurization system: based on the generation, migration and transformation mechanism of the multiple pollutant as well as the removal mechanism of the multiple pollutants in the desulfurization system, a corresponding relationship of inlet $SO_2$ concentration, inlet flue gas temperature, liquid-gas ratio, slurry density and pH with outlet $SO_2$ concentration of the desulfurization system, a corresponding relationship of inlet $SO_3$ concentration, inlet $SO_2$ concentration, inlet dust content, inlet flue gas temperature, liquid-gas ratio and flue gas velocity with outlet $SO_3$ concentration of the desulfurization system, and a corresponding relationship of inlet Hg concentration, inlet dust content, load, flue gas velocity and inlet flue gas temperature with outlet Hg concentration of the desulfurization system are established by combining coal qualities, boiler operating parameters, inlet flue gas parameters of the desulfurization system and operating parameter historical data of the desulfurization system, and then, a model for accurately describing the multi-pollutant simultaneous removal process of the desulfurization system is obtained.

Accurate modeling of the multi-pollutant simultaneous removal and transformation process of the denitration system: based on the operating mechanism of a selective catalytic reduction (SCR) denitration system, a corresponding relationship of inlet $NO_x$ concentration, flue gas parameters, reaction condition and reducer supply with outlet $NO_x$ concentration of the denitration system, a corresponding relationship of inlet $SO_2$ concentration, flue gas parameters, reaction condition and reducer supply with $SO_2$-to-$SO_3$ transformation rate in the denitration system, and a corresponding relationship of inlet Hg concentration, flue gas parameters, reaction condition and reducer supply with transformation ratio of particulate mercury ($Hg^P$), mercury oxides ($Hg^{2+}$ and $Hg^+$) and elementary mercury)($Hg^0$) in the denitration system are established by combining inlet flue gas parameters, online detection results of the CEMS and of operating parameter historical data of the denitration system; then, a model for accurately describing the multi-pollutant simultaneous removal and transformation process of the denitration system under different conditions and operating parameters is obtained based on these corresponding relationships.

Accurate modeling of the multi-pollutant removal process of the precipitation system: based on the particulate matter removal mechanism of an electrostatic precipitation system, a corresponding relationship of coal quality, load, flue gas temperature, flue gas rate and operating voltage with outlet particulate matter concentration of a dry electric precipitator, a corresponding relationship of coal quality, load, flue gas temperature, flue gas rate, theoretical $SO_3$ concentration of the denitration system, operating voltage and outlet $SO_3$ concentration of the dry electric precipitator, a corresponding relationship of coal quality, load, flue gas temperature, flue gas rate, theoretical Hg concentration of the denitration system and outlet Hg concentration of the dry electric precipitator, a corresponding relationship of coal quality, load, flue gas temperature, flue gas rate, circulating water quantity, operating voltage and outlet particulate matter concentration of a wet electric precipitator, a corresponding relationship of coal quality, load, flue gas temperature, flue gas rate, inlet $NO_x$ concentration, circulating water quantity, circulating water pH, operating voltage and outlet $NO_x$ concentration of the wet electric precipitator, a corresponding relationship of coal quality, load, flue gas temperature, flue gas rate, inlet $SO_2$ concentration, circulating water quantity, circulating water pH, operating voltage and outlet $SO_2$ concentration of the wet electric precipitator, a corresponding relationship of coal quality, load, flue gas temperature, flue gas rate, inlet $SO_3$ concentration, circulating water quantity, circulating water pH, operating voltage and outlet $SO_2$ concentration of the wet electric precipitator, and a corresponding relationship of coal quality, load, flue gas temperature, flue gas rate, inlet Hg concentration, circulating water quantity, circulating water pH, operating voltage and outlet Hg concentration of the wet electric precipitator are established by combining coal quality, boiler operating parameters, inlet flue gas parameters of the electrostatic precipitation system, and historical operating data; a model for accurately describing the multi-pollutant simultaneous removal process of the precipitation system is obtained.

Preferably, accurate prediction of the multi-pollutant generation process refers to accurate prediction of the concentration of multiple pollutants, including $NO_x$, $SO_2$, $SO_3$, PM and Hg at a boiler outlet according to real-time boiler operating data and periodically-updated coal quality reports;

A boiler model is established through the following steps:
S101: collecting boiler parameters, coal quality parameters and a boiler outlet test report;
S102: collecting long-term operating historical data including boiler coal feed, flue gas, water, and boiler outlet pollutant concentrations detected by the CEMS;
S103: marking out typical boiler load intervals according to the test report and online operating data, and obtaining corresponding datasets of boiler operating parameters, coal qualities and outlet pollutant concentrations in the typical boiler load intervals;
S104: for pollutants, data of which is monitored online by the CEMS, obtaining a corresponding relationship of the boiler operating data and coal quality parameters with outlet pollutant concentrations through a data modeling method, based on the datasets;
S105: for pollutants, data of which is not monitored online by the CEMS, obtaining a corresponding relationship of the boiler operating data and the coal quality parameters with outlet pollutant concentrations through a data modeling method according to coal quality data and the test report, based on the dataset; and
S106: combining the model obtained in S104 and the model obtain in S105 to obtain a boiler-side multi-pollutant concentration prediction model.

Preferably, the model for accurately describing the multi-pollutant simultaneous removal process of the desulfurization system is obtained specifically through the following steps:
S201: collecting design parameters and test reports of all devices of the desulfurization system;
S202: collecting online operating historical data of the desulfurization system, including boiler load, inlet flue gas parameters, flue gas rate, pH, liquid-gas ratio, slurry density, and inlet concentration and outlet concentrations;
S203: marking out typical load intervals and pollutant concentration intervals according to data distribution, and obtaining corresponding datasets of boiler loads, coal qualities and outlet pollutant concentrations in the typical boiler load intervals and the pollutant concentration interval;
S204: based on the datasets, establishing an $SO_2$ removal mechanism model in the typical boiler load intervals and in the pollutant concentration intervals according to the $SO_2$ removal mechanism of a desulfurization tower, and correcting the model according to historical data to obtain corresponding relationships of inlet $SO_2$ concentration, inlet flue gas parameters, liquid-gas ratio, slurry density and pH with outlet $SO_2$ concentration in the typical boiler load intervals and the pollutant concentration intervals;
S205: based on the datasets, obtaining corresponding relationships of inlet $SO_3$ concentration, inlet $SO_2$ concentration, inlet dust content, inlet flue gas temperature, liquid-gas ratio and flue gas velocity with outlet $SO_3$ concentration of the desulfurization system and corresponding relationships of inlet Hg concentration, inlet dust content, load, flue gas velocity and inlet flue gas temperature with outlet Hg concentration, in the typical boiler load intervals and the pollutant concentration intervals through a data modeling method according to results of the test reports; and
S206: based on these corresponding relationships, obtaining the model for accurately describing the multi-pollutant simultaneous removal and transformation process of the desulfurization system under different conditions and operating parameters.

Preferably, the model for accurately describing the multi-pollutant simultaneous removal and transformation process of the denitration system is established specifically through the following steps:

S301: collecting design parameters of a denitration device, catalyst parameters, a catalyst test report, and a reducer test report;

S302: collecting historical data having an influence on online operation of the denitration device, including boiler load, operating temperature, flue gas rate, reducer supply, and inlet and outlet pollutant concentrations detected by the CEMS;

S303: marking out typical load intervals and pollutant concentration intervals according to data distribution, and obtaining corresponding datasets of boiler load, coal quality and outlet pollutant concentration in the typical boiler load intervals and the pollutant concentration intervals;

S304: based on the datasets, establishing a mechanism model of the denitration device in the typical boiler load intervals and the pollutant concentration intervals according to the $NO_x$ removal mechanism of the denitration system, and correcting the model according to the historical data to obtain corresponding relationships of inlet $NO_x$ concentration, flue gas parameter, reaction condition and reducer supply with the outlet $NO_x$ concentration of the denitration device, in the typical boiler load intervals and the pollutant concentration intervals;

S305: based on the datasets, obtaining corresponding relationships of inlet $SO_2$ concentration, flue gas parameters, reaction condition and reducer supply with the $SO_2$-to-$SO_3$ transformation rate in the denitration device, and corresponding relationships of inlet Hg concentration, flue gas parameters, reaction condition and reducer supply with the transformation rate of particulate mercury ($Hg^P$), mercury oxides ($Hg^{2+}$ and $Hg^+$) and elementary mercury)($Hg^0$) in the denitration system, in the typical boiler load intervals and the pollutant concentration intervals according to results in the test reports through a data modeling method; and S306: based on these corresponding relationships, obtaining the model for accurately describing the multi-pollutant simultaneous removal and transformation process of the denitration system under different conditions and operating parameters.

The model for accurately describing the multi-pollutant simultaneous removal process of the precipitation system is established specifically through the following steps:

S401: collecting design parameters and test reports of electrostatic precipitators;

S402: collecting historical data having an influence on online operation of the electrostatic precipitators, including boiler load, operating temperature, flue gas rate, secondary voltage, secondary current, and inlet and outlet pollutant concentrations detected by the CEMS;

S403: marking out typical load intervals and pollutant concentration intervals according to data distribution, and obtaining corresponding datasets of boiler load, coal quality and outlet pollutant concentration in the typical boiler load intervals and the pollutant concentration intervals;

S404: based on the datasets, establishing PM removal mechanism models of the electrostatic precipitators in the typical boiler load intervals and the pollutant concentration intervals according to the PM removal mechanism of the electrostatic precipitators, and correcting the models by means of the historical data to obtain corresponding relationships of inlet PM concentration, flue gas parameter and operating voltage with the outlet PM concentration of the electrostatic precipitators, in the typical boiler intervals and the pollutant concentration intervals;

S405: based on the datasets, obtaining corresponding relationships of inlet $SO_3$ concentration, inlet PM concentration, boiler load, operating temperature, flue gas rate operating voltage and outlet $SO_3$ concentration and corresponding relationships of inlet Hg concentration, inlet PM concentration, boiler load, operating temperature, flue gas rate, operating voltage and outlet Hg concentration in the typical boiler load intervals and the pollutant concentration intervals through a data modeling method (such as a neural network algorithm) according to results of the test report; and S406: based on these corresponding relationships, obtaining the model for accurately describing the multi-pollutant simultaneous removal and transformation process of the precipitation system under different conditions and operating parameters.

By means of accurate modeling of the multi-pollutant removal and transformation process of the denitration system, real-time description of the dynamic transformation process of $NO_x$, $SO_2$, $SO_3$ and Hg and accurate prediction of the concentration are realized; during accurate modeling of the multi-pollutant simultaneous removal process of the desulfurization system, inlet flue gas parameters include inlet flue gas temperature, inlet $SO_2$ concentration, inlet $SO_3$ concentration, inlet particulate matter concentration and inlet Hg concentration, and outlet flue gas parameters include outlet flue gas temperature, outlet $SO_2$ concentration, outlet $SO_3$ concentration, outlet particulate matter concentration and outlet Hg concentration; the established mechanism models are corrected by coherent combination.

The global operating cost evaluation method of the ultra-low emission system specifically includes operating costs and fixed costs of all pollutant emission reduction systems;

Regarding to a limestone-gypsum wet desulphurization system, a total operating cost and a fixed cost are expressed as:

$$COST_{WFGD}=COST_{bf}+COST_{sa}+COST_{scp}+COST_{oab}+COST_{CaCO_3}+COST_{WFGD\_w}-R_{CaSO_4}$$

$$COST_{WFGD\_fix}=COST_{WFGD\_d}+COST_{WFGD\_r}+COST_{WFGD\_m}$$

Wherein, power consumption of booster fans $COST_{bf}$, power consumption of oxidization blowers $COST_{sa}$, power consumption of slurry circulating pumps $COST_{scp}$, power consumption of slurry agitators $COST_{oab}$, a limestone slurry cost $COST_{CaCO_3}$, a process water cost $COST_{WFGD\_w}$, a by-product gypsum revenue $R_{CaSO_4}$, a depreciation cost $COST_{WFGD\_d}$, a repair cost $COST_{WFGD\_r}$, and a manual cost $COST_{WFGD\_m}$ are included.

The operating cost of the desulfurization system includes energy consumption and material consumption, wherein the energy consumption is mainly generated by a motor of the desulfurization system and includes the power consumption of booster fans, the power consumption of oxidization blowers, the power consumption of slurry circulating pumps and the power consumption of the slurry agitators, and the costs are calculated as follows:

$$COST_{bf} = \frac{1}{q} \times \sqrt{3} \cos\varphi\left(\Sigma_{i=1}^{n_{bf}} I_i U_i\right) \times P_E \times \alpha_{WFGD}$$

-continued $$COST_{sa} = \frac{1}{q} \times \sqrt{3} \cos\varphi \left(\sum_{i=1}^{n_{sa}} I_i U_i\right) \times P_E$$

$$COST_{scp} = \frac{1}{q} \times \sqrt{3} \cos\varphi \left(\sum_{i=1}^{n_{scp}} I_i U_i\right) \times P_E$$

$$COST_{oab} = \frac{1}{q} \times \sqrt{3} \cos\varphi \left(\sum_{i=1}^{n_{oab}} I_i U_i\right) \times P_E$$

wherein, q is a real-time boiler load, $n_{bf}$, $n_{sa}$, $n_{scp}$ and $n_{oab}$ respectively represent the number of booster fans in operation, the number of oxidization fans in operation, the number of slurry circulating pumps in operation and the number of slurry agitators in operation, $U_i$ and $I_i$ respectively represent the voltage and current of the $i^{th}$ facility, cos φ is a power factor and is generally 0.8, and $P_E$ is the electricity price;

$\alpha_{WFGD}$ is the ratio of the resistance of a desulfurization tower to the total resistance in the second half and is calculated as follows:

$$\alpha_{WFGD} = \frac{p_{dt}}{p_{dt} + p_{WESP} + p_{gd2}}$$

Wherein, $p_{dt}$ is a pressure drop of the desulfurization tower, $p_{WESP}$ is a pressure drop of the wet electrostatic precipitator under resistance, and $p_{gd2}$ is a pressure drop of a gas duct under resistance.

Material consumption of the desulfurization system includes limestone consumption and process water consumption, a desulfurization absorber adopted by the limestone-gypsum wet desulphurization system is limestone slurry, and in accordance with material balance, the cost, namely limestone consumption, of power generation per unit is calculated as follows:

$$COST_{CaCO_3} = \frac{1}{q} \times (c_{SO_2\_in} - c_{SO_2\_out}) \times V \times \frac{M_{CaCO_3}}{M_{SO_2}} \times \frac{\delta_1}{\lambda} \times P_{CaCO_3}$$

Wherein, $c_{SO_2\_in}$ and $c_{SO_2\_out}$ respectively represent $SO_2$ concentrations of inlet flue gas and outlet flue gas of the desulfurization system, $M_{CaCO_3}$ and $M_{SO_2}$ respectively represent molecular weights of $CaCO_3$ and $SO_2$, $\lambda$ represents the purity of limestone, $P_{CaCO_3}$ represents the price of limestone, $\delta_1$ represents a calcium-sulfur ratio and is generally set to 1.02-1.05, and V represents the flue gas rate which is in a positive correlation with the boiler load and is calculated according to the following formula:

$$V = m \times q \times V_{tc}$$

Wherein, $V_{tc}$ is the amount of flue gas generated by coal per unit, and m is the coal quality.

The process water consumption is calculated as follows:

$$COST_{WFGD\_w} = \frac{1}{q} \times (c_{SO_2\_in} - c_{SO_2\_out}) \times V \times \frac{M_{CaCO_3}}{M_{SO_2}} \times \frac{\delta_1}{\lambda} \times \frac{2M_{H_2O}}{M_{CaCO_3}} \times P_w$$

Wherein, $M_{H_2O}$ is the molecular weight of water, and $P_w$ is the price of water.

Because gypsum is generated as a by-product when SO2 in flue gas is removed, the gypsum, as revenue obtained in the operating process of the desulfurization system, is included in cost calculation of the limestone-gypsum wet desulfurization system, and the revenue is calculated as follows:

$$R_{CaSO_4} = \frac{1}{q} \times (c_{SO_2\_in} - c_{SO_2\_out}) \times V \times \frac{M_{CaCO_3}}{M_{SO_2}} \times P_{CaSO_4}$$

Wherein, $M_{CaSO_4}$ is the molecular weight of gypsum, and $P_{CaSO_4}$ is the price of gypsum;

The fixed cost of the desulfurization system includes the depreciation cost COSTWFGD_d, the repair cost COSTWFGD_r and the manual cost COSTWFGD_m which are respectively calculated as follows:

$$COST_{WFGD\_d} = \frac{1}{Q \times H} \times \frac{P_{WFGD\_init} \times \eta_{WFGD}}{Y_{WFGD}}$$

$$COST_{WFGD\_r} = \frac{1}{Q \times H} \times P_{WFGD\_init} \times \eta_{WFGD\_r}$$

$$COST_{WFGD\_m} = \frac{1}{Q \times H} \times \sum_{i=1}^{n_{WFGD}} S_{WFGD_i}$$

Wherein, Q is the capacity of a unit, H is annual operating hours of the unit, $P_{WFGD\_init}$ is an initial investment cost of the desulfurization system, $\eta_{WFGD}$ is a fixed assets formation rate of the desulfurization system, $Y_{WFGD}$ is a depreciable life of the desulfurization system, $\eta_{WFGD\_r}$ is the proportion of the repair cost of the desulfurization system to an investment cost, $n_{WFGD}$ is the total number of workers, and $S_{WFGD_i}$ is the annual salary of the $i^{th}$ worker of the desulfurization system.

Regarding to the SCR denitration system, a total operating cost and a fixed cost are expressed as follows:

$$COST_{SCR} = COST_{SCR\_idf} + COST_{sb} + COST_{adf} + COST_{NH_3} + COST_C$$

$$COST_{SCR\_fix} = COST_{SCR\_d} + COST_{SCR\_r} + COST_{SCR\_m}$$

The operating cost includes energy consumption and material consumption, and the energy consumption includes power consumption of induced draft fans, power consumption of soot blowers and power consumption of dilution fans, which are respectively calculated as follows:

$$COST_{SCR\_idf} = \frac{1}{q} \times \sqrt{3} \cos\varphi \left(\sum_{i=1}^{n_{idf}} I_i U_i\right) \times P_E \times \alpha_{SCR}$$

$$COST_{sb} = \begin{cases} \frac{P_{steam}}{CV_s} \times CV + \sum_{i=1}^{n_{sb}} P_i & \text{Steam blowing} \\ \frac{1}{6} \times \sum_{i=1}^{n_{sb}} P_i & \text{Acoustic blowing} \end{cases}$$

$$COST_{adf} = \frac{1}{q} \times \sqrt{3} \cos\varphi \left(\sum_{i=1}^{n_{adf}} I_i U_i\right) \times P_E$$

Wherein, $n_{idf}$, $n_{sb}$ and $n_{adf}$ are respectively the number of induced draft fans in operation, the number of soot blowers in operation, and the number of dilution fans in operation, and αSCR represents the ratio of the resistance of a denitration reactor to the total resistance in the first half and is calculated as follows:

$$\alpha_{SCR} = \frac{p_{SCR}}{p_{idf}}$$

Regarding to a soot blowing system, the operating cost is calculated in different ways according to different soot blowing manners, wherein $P_{steam}$ is empirical steam consumption, $CV_s$ is empirical reference catalyst consumption, and CV is actual catalyst consumption.

The material consumption of the denitration system includes a liquid ammonia cost and a catalyst cost, and in accordance with material balance, the liquid ammonia cost is calculated as follows:

$$COST_{NH_3} = \frac{1}{q} \times (c_{NO_x\_in} - c_{NO_x\_out}) \times V \times \frac{M_{NH_3}}{M_{NO}} \times \frac{2}{3} \times \frac{1}{\delta_2} \times \frac{ae \times M_{NH_3}}{V_m} \times P_{NH_3}$$

Wherein, $C_{NO_x\_in}$ and $C_{NO_x\_out}$ respectively represent NOx concentrations of inlet flue gas and outlet flue gas of the denitration system, $M_{NH_3}$ and $M_{NO}$ respectively represent molecular weights of $NH_3$ and NO, and $P_{NH_3}$ is the price of liquid ammonia.

The catalyst cost is calculated as follows:

$$COST_C = \frac{CV \times P_c}{3Qh}$$

Wherein, $P_c$ is the price of a catalyst, Q is the capacity of a unit, and h is the annual operating hours of the unit;

The fixed cost of the denitration system includes a depreciation cost $COST_{SCR\_d}$, a repair cost $COST_{SCR\_r}$ and a manual cost $COST_{SCR\_m}$, which are respectively calculated as follows:

$$COST_{SCR\_d} = \frac{1}{Q \times H} \times \frac{P_{SCR\_init} \times \eta_{SCR}}{Y_{SCR}}$$

$$COST_{SCR\_r} = \frac{1}{Q \times H} \times P_{SCR\_init} \times \eta_{SCR\_r}$$

$$COST_{SCR\_m} = \frac{1}{Q \times H} \times \sum_{i=1}^{n_{SCR}} S_{SCR_i}$$

Wherein, $P_{SCR\_init}$ is an initial investment cost of the denitration system, $\eta_{SCR}$ is a fixed assets formation rate of the denitration system, $Y_{SCR}$ is a depreciable life of the denitration system, $\eta_{SCR\_r}$ is the proportion of the repair cost of the denitration system to the investment cost, $n_{SCR}$ is the total number of workers of the denitration system, and $S_{SCR_i}$ is the annual salary of the $i^{th}$ worker;

The operating costs include power consumption, and power consumption of a dry electrostatic precipitator includes power consumption of induced draft fans and power consumption of power supplies, which are respectively calculated as follows:

$COST_{ESP} = COST_{ESP\_idf} + COST_{ESP\_e}$ $COST_{ESP\_fix} = COST_{ESP\_d} + COST_{ESP\_r} + COST_{ESP\_m}$ $COST_{WESP} = COST_{WESP\_idf} + COST_{WESP\_e} + COST_{WESP\_w} + COST_{Na} + COST_{wc}$ $COST_{WESP\_fix} = COST_{WESP\_d} + COST_{WESP\_r} + COST_{WESP\_m}$ The operating costs include power consumption, and power consumption of a dry electrostatic precipitator includes power consumption of induced draft fans and power consumption of power supplies, which are respectively calculated as follows:

$$COST_{ESP_{idf}} = \frac{1}{q} \times \sqrt{3} \cos\varphi (\Sigma_{i=1}^{n_{idf}} I_i U_i) \times P_E \times \alpha_{ESP}$$

$$COST_{ESP\_e} = \frac{1}{q} \times \sqrt{3} \cos\varphi \left(\sum_{i=1}^{n_e} I_i U_i\right) \times P_E$$

Wherein, $n_e$ is the number of electric fields, and is the proportion of the resistance of the dry electrostatic precipitator to the total resistance of a first half of the ultra-low emission system and is calculated as follows:

$$\alpha_{ESP} = \frac{p_{ESP}}{p_{idf}}$$

Power consumption of a wet electrostatic precipitator includes power consumption of induced draft fans, power consumption of power supplies, a power cost and a material cost, and the power consumption of induced draft fans of the wet electrostatic precipitator is calculated as follows:

$$COST_{WESP\_idf} = \frac{1}{q} \times \sqrt{3} \cos\varphi(\Sigma_{i=1}^{n_{idf}} I_i U_i) \times P_E \times \alpha_{WESP}$$

$$\alpha_{WESP} = \frac{p_{WESP}}{p_{idf}}$$

The power consumption of power supplies of the wet electrostatic precipitator is:

$$COST_{WESP\_e} = \frac{1}{q} \times \sqrt{3} \cos\varphi(\Sigma_{i=1}^{n_e} I_i U_i) \times P_E$$

Compared with the dry electrostatic precipitator, the wet electrostatic precipitator has the power cost and the material cost, and the power cost mainly refers to power consumption of a water circulation system;

$$COST_{wc} = \frac{1}{q} \times \sqrt{3} \cos\varphi(\Sigma_{i=1}^{n_{wc}} I_i U_i) \times P_E$$

The material cost of the wet electrostatic precipitator includes a process water cost and an alkali consumption cost, which are calculated as follows:

$$COST_{WESP\_w} = \frac{1}{q} \times w \times P_w$$

$$COST_{Na} = \frac{1}{q} \times Na \times P_{Na}$$

The fixed costs of the dry electrostatic precipitation system and the wet electrostatic precipitation system include depreciation costs $COST_{ESP\_d}$ and $COST_{WESP\_d}$, repair costs $COST_{ESP\_r}$ and $COST_{WESP\_r}$, and manual costs $COST_{ESP\_m}$ and $COST_{WESP\_m}$, which are respectively calculated as follows:

$$COST_{ESP\_d} = \frac{1}{Q \times H} \times \frac{P_{WESP\_init} \times \eta_{ESP}}{Y_{ESP}}$$

$$COST_{WESP\_d} = \frac{1}{Q \times H} \times \frac{P_{WESP\_init} \times \eta_{WESP}}{Y_{WESP}}$$

$$COST_{ESP\_r} = \frac{1}{Q \times H} \times P_{ESP\_init} \times \eta_{ESP\_r}$$

$$COST_{WESP\_r} = \frac{1}{Q \times H} \times P_{WESP\_init} \times \eta_{WESP\_r}$$

$$COST_{ESP\_m} = \frac{1}{Q \times H} \times \sum_{i=1}^{n_{ESP}} S_{ESP_i}$$

$$COST_{WESP\_m} = \frac{1}{Q \times H} \times \sum_{i=1}^{n_{WESP}} S_{WESP_i}$$

Wherein, $P_{ESP\_init}$ and $P_{WESP\_init}$ respectively represent initial investment costs of the dry electrostatic precipitation system and the wet electrostatic precipitation system, $\eta_{ESP}$ and $\eta_{WESP}$ respectively represent fixed assets formation rates of the dry electrostatic precipitation system and the wet electrostatic precipitation system, $Y_{ESP}$ and $Y_{WESP}$ respectively represent a depreciable life of the dry electrostatic precipitation system and a depreciable life of the wet electrostatic precipitation system, $\eta_{ESP\_r}$ and $\eta_{WESP\_r}$ respectively represent the ratio of the repair cost of the dry electrostatic precipitation system to the investment cost and the ratio of the repair cost of the wet electrostatic precipitation system to the investment cost, $n_{ESP}$ and $n_{WESP}$ respectively represent the total number of workers of the dry electrostatic precipitation system, and $S_{ESP_i}$ and $S_{WESP_i}$ respectively represent the annual salary of the $i^{th}$ worker of the dry electrostatic precipitation system.

Based on accurate modeling of the multi-device, multi-pollutant simultaneous removal process and global operating cost evaluation, the multi-pollutant, multi-target and multi-condition global operating optimization method is applied to a typical intelligent multi-pollutant ultra-low emission system constituted by an SCR denitration system, a dry electrostatic precipitation (ESP) system, a wet flue gas desulphurization (WFGD) system and a wet electrostatic precipitation (WESP) system to realize minute-level planning and optimization of emission reductions of a global pollutant emission reduction device under different emission targets through sub-disciplinary decomposition of different pollutants and global and local swarm intelligence algorithms by means of a simultaneous removal effect of the devices on the pollutants and the mutual inter-coupling and competition relationship of the pollutants.

Preferably, a disperse policy decision method based on a collaborative optimization algorithm is used as a solution to multi-model optimization of the operation of the complicated intelligent multi-pollutant ultra-low emission system in a coal-fired power plant and has high system autonomy and good adaptability, multiple models are resolved independently and have to be repeatedly coordinated to guarantee the consistency of decision results, which causes some communication costs, but the decision results are optimal because the solution process is carried out based on optimal solutions of the models.

According to the collaborative optimization algorithm, expected values of coupling variables are transmitted from a system level to discipline levels at first, and under the condition of meeting corresponding constraints, the discipline levels are separately optimized to make optimization results closest to the expected values provided by the system level; then, the optimization results are transmitted to the system level; after receiving the optimization results of the discipline levels, the system level coordinates the coupling variables and generates new expected values of the coupling variables; the new expected values are transmitted to the discipline levels again; a feasible solution that makes the coupling variables consistent and meets optimization targets is finally obtained through repeated iterations between the system level and the discipline levels.

According to the advanced control method for reliable up-to-standard ultra-low emission of the pollutants, dynamic property response models of manipulated variables and disturbance parameters of pollutant removal devices to pollutant removal are established based on real-time data, and under the condition of set emission reduction values of the devices, control variables of the pollutant removal devices are optimized and controlled in real time through a model prediction and control method; the dynamic property response models are updated online to better adapt to large-delay, non-linearity and variable-load characteristics of the system, and even if system parameters change, margin control of pollutant emission can be realized, and pollutant removal costs are further reduced when the system varies.

Nine pollutant-removal dynamic property response models for load increase, load decrease and load maintaining under high, medium and small load conditions are established, and in different load change stages, different dynamic property response models are used to calculate the control variables of the pollutant removal devices to better conform to actual changes of the system.

Online updating of the models refer to parameter substitutions of the models every a certain period of time in case of not meeting dynamic response properties, and the period of time varies according to different properties of the desulfurization system, the denitration system and the precipitation system, wherein as for the denitration system which sprays ammonia rapidly and changes quickly, the model will be updated every one hour; as for the desulfurization system which regulates pH slowly, the model will be updated every one day; as for the precipitation system which adopts physical removal and has the highest reaction speed, the model will be updated every ten minutes.

A boiler performance database, an environmentally-friendly device performance database, a system operating database, and a raw material (coal quality, absorbent, etc.) database are established by acquiring parameters of the key devices of the system and the boiler and establishing a cost evaluation model and a pollutant prediction model to generate secondary parameters, such as energy consumption and target rate, of the system. The boiler performance database and the coal quality database are used to predict the concentration of the pollutants at the boiler outlet. The device performance database, an absorbent characteristic database and the system operating database are used to predict the concentration of the pollutants on the cross-section of inlets/outlets of the environmentally-friendly devices.

Data acquired by the databases of the ultra-low emission system includes coal quality data, material data, online monitoring data and online operating data, and data obtained by model establishment includes management data and evaluation data. The key devices include a boiler, a denitration device, precipitators, a desulfurization device, and the like. Acquired material information mainly includes coal quality, ammonia, lime, soot, gypsum, water, and the like.

The system operating database includes online operating data of the environmentally-friendly devices such as the denitration device, the desulfurization device and the precipitators in the ultra-low emission system, and online operating data of the boiler. Based on an established IoT system, key data points having an influence on the devices are obtained according to the operating characteristics and optimization and modeling requirements of the devices, and are then acquired and sorted to establish databases to support system modeling, evaluation and operation optimization.

The present invention has the following beneficial effects:

1. To realize a variable load of a boiler and intelligent and coordinative control of a coal-variable ultra-low emission system, efficient removal of pollutants and low-cost operation, an intelligent multi-pollutant ultra-low emission system of a four-layer structure comprising a device layer, a sensing layer, a control layer and an optimization layer from bottom to top is provided, a control information flow in the system sequentially flows through the optimization layer, the control layer, the sensing layer and the device layer from top to bottom, and a feedback information flow flows through these layer from bottom to top. Various databases about design parameters, operating parameters, energy consumption and material consumption are established based on the intelligent multi-pollutant ultra-low emission system and the integrated key device information flows to support the development of modeling, control and optimization modules of intelligent control of the ultra-low emission system.

2. Compared with control research based on a single-pollutant removal device, the intelligent multi-pollutant ultra-low emission system has a long technological process, and from the aspect of control, the intelligent multi-pollutant ultra-low emission system is a complicated industrial process featured by multiple inputs, multiple outputs, strong coupling, strong nonlinearity, variable parameters, multiple conditions, wide-range variable loads and the like. On the basis of existing ultra-low emission systems, the invention realizes simultaneous removal of multiple flue gas pollutants, improves the simultaneous removal effect of multiple pollutants such as nitrogen oxide, sulfur oxide, particulate matter and mercury, effectively improves the multi-pollutant efficient removal effect of flue gas emission reduction devices, reduces operating costs, improves the operating adaptability under different conditions, has high technical and application values, and has great significance for efficient, stable, reliable, low-cost and environmentally-friendly operation of ultra-low emission systems.

BRIEF DESCRIPTION OF THE SEVERAL VIEWS OF THE DRAWINGS

FIG. 7(a), FIG. 7(b) and FIG. 7(c) are a second graph of the operating cost composition of the intelligent multi-pollutant ultra-low emission system under different conditions of the invention.

DETAILED DESCRIPTION OF THE INVENTION

The present invention is further explained below in conjunction with the accompanying drawings and specific embodiments, but the protection scope of the invention is not limited to the following description.

Figure 1:
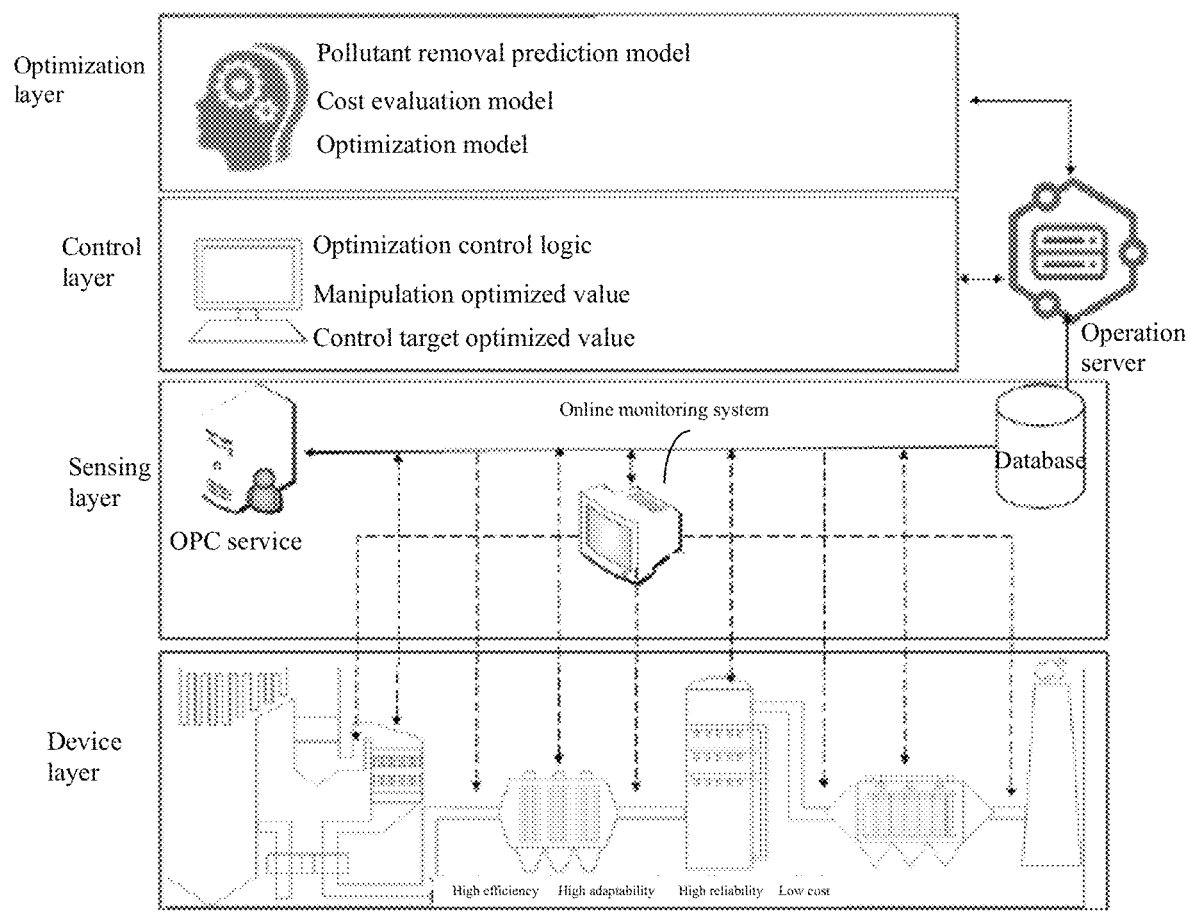
FIG. 1 is an architecture diagram of an intelligent multi-pollutant ultra-low emission system of the invention.

Referring to FIG. 1, an intelligent multi-pollutant ultra-low emission system comprises a device layer, a sensing layer, a control layer and an optimization layer from bottom to top. A control information flow in the system sequentially flows through the optimization layer, the control layer, the sensing layer and the device layer from top to bottom, and a feedback information flow flows through these layers from bottom to top.

Referring to FIG. 1, the device layer of the intelligent multi-pollutant ultra-low emission system mainly comprises key pollutant removal devices including an SCR denitration device, an electrostatic precipitator, a wet flue gas desulfurization device and a wet electrostatic precipitator, wherein the SCR denitration device and the wet flue gas desulfurization device operate mainly depending on a DCS system, and the amount of injected ammonia can be automatically regulated by means of ammonia-nitrogen ratio control, feedback control, cascade control and the like; start and stop of a circulating pump of the wet flue gas desulfurization device are manually completed by operators; the electrostatic precipitator and the wet electrostatic precipitator can operate under constant voltages (by regulating secondary currents to guarantee constant secondary voltages) and under constant currents (by regulating secondary voltages to guarantee constant secondary currents) through a PLC system by means of a control logic in a power supply.

The sensing layer of the intelligent multi-pollutant ultra-low emission system mainly comprises a physical sensing system and a network structure (including a bottom layer, an intermediate layer and an upper layer). The physical sensing layer mainly comprises a flue gas online monitoring system, a local detection and feedback system for DCS key elements (such as analog signals fed back by pump motors and switch quantity signals fed back by valves), and a measurement system included in the DCS system (liquid level, pH and liquid density detectors). The bottom layer of the network structure is an upgraded DCS control layer originally possessed by an enterprise and is a basic control network segment. The intermediate layer of the network structure is a data acquisition and processing layer of the intelligent multi-pollutant ultra-low emission system and is configured with an operation server, a database server, a WEB server, an application server and the like. The upper layer of the network structure is an enterprise management layer, is an office network segment based on an original intranet of an enterprise and allows users to have access to the intelligent multi-pollutant ultra-low emission system easily by visiting a website. The sensing layer is an information hinge of the intelligent multi-pollutant ultra-low emission system, communicates with the original DCS system of the intelligent multi-pollutant ultra-low emission system in real time through an OPC service, and is used for acquiring, preprocessing, integrating, storing and issuing information by means of a pollutant online detection device, a distributed control system and other sensing and communication systems.

The control layer of the intelligent multi-pollutant ultra-low emission system is an important intermediate layer for controlling key manipulated variables according to real-time operating conditions and optimized parameter settings to guarantee stable up-to-standard operation and optimal regulation of the system. Advanced control methods including optimizing control logics, optimizing manipulated variables and controlling target optimization values are established by studying the operating characteristics and key influence factors of all the key devices to realize advanced control of the pollutant removal process of the intelligent multi-pollutant ultra-low emission system, promote rational allocation of energy and resources and improve the pollutant control level.

Figure 3:
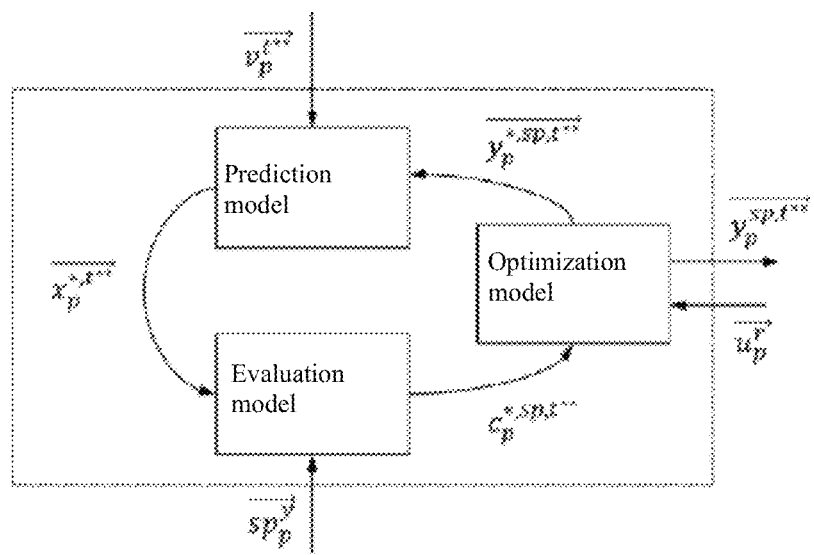
FIG. 3 is an architecture diagram of an optimization layer.

The optimization layer is a key layer for realizing efficient simultaneous removal of multiple pollutants in the intelligent multi-pollutant ultra-low emission system, fulfills the optimization of global set points by establishing an optimization model, a prediction model and a cost evaluation model, and has the functions of balancing emission reductions of all the devices and optimizing global material and energy distributions of the ultra-low emission system. Referring to FIG. 3, the prediction model in the optimization layer is a multi-device multi-pollutant simultaneous removal model, and predicted outlet pollutant concentration vector values $\overrightarrow{y_p^{*,sp,t^{**}}}$ of all pollutant emission reduction devices are obtained according to a predicted global optimization setting vector value $\overrightarrow{x_p^{*,t^{**}}}$ output by the optimization model; the cost evaluation model evaluates the operation of the ultra-low emission system and obtains a specific cost vector $\overrightarrow{c_p^{*,sp,t^{**}}}$ according to $\overrightarrow{x_p^{*,t^{}}}$ and $\sqrt{sp_p^y}$; the optimization model optimizes $\overrightarrow{y_p^{sp,t^{}}}$ through by establishing an optimization algorithm.

Figure 2:
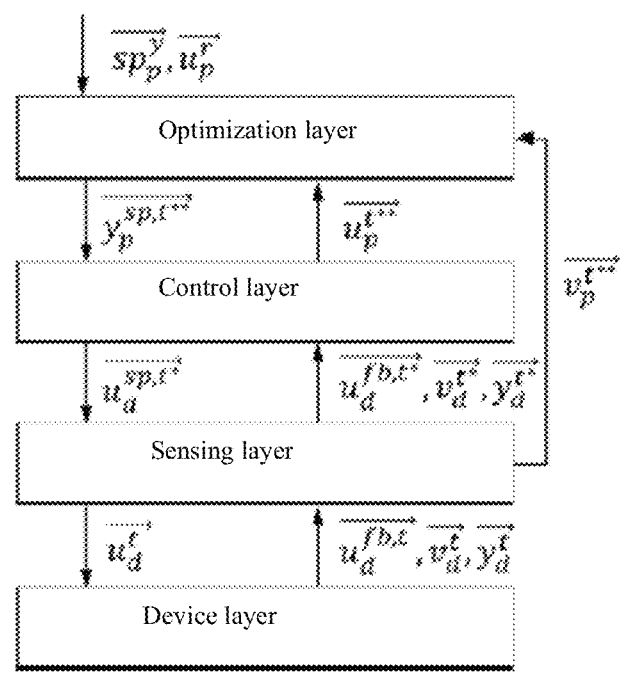
FIG. 2 is an information flow diagram of the intelligent multi-pollutant ultra-low emission system of the invention.

Referring to FIG. 2, information flows in the sensing layer, the control layer and the optimization layer of the intelligent multi-pollutant ultra-low emission system adopt different time scales which are t, t* and t**, respectively. Wherein, t represents a real-time scale mainly used for online monitoring and local control, t* represents a second scale (also referred to as control scale) mainly used for reception and feedback of second-level signals of the control layer, and t** represents a minute scale or a superior scale (also referred to as a global scale) mainly used for instruction optimization and allocation of the optimization layer. All the time scales are expressed in a superscript form in variables, and quantities without time scales are constant quantities.

According to the present invention, a boiler performance database, an environmentally-friendly device performance database, a system operating database, and a raw material (coal quality, absorbent, or the like) database are established by acquiring key parameters of the key devices of the system and a boiler and establishing the cost evaluation model and the pollutant prediction model to generate secondary parameters of the system such as energy consumption and target rates. The boiler performance database and a coal quality database are used to predict the concentration of multiple pollutants at a boiler outlet. The device performance database, an absorbent characteristic database and the system operating database are used to predict the concentration of multiple pollutants on the cross-section of inlets/outlets of the environmentally-friendly devices.

Referring to FIG. 4-FIG. 7, a global optimization method of the intelligent multi-pollutant ultra-low emission system comprises: obtaining, based on the optimization layer, an accurate description of multiple pollutants (including nitrogen oxide ($NO_x$), sulfur oxide ($SO_2$ and $SO_3$), particulate matter (PM) and heavy metal (Hg), and the like) in the generation, migration, transformation and removal process in multiple devices by means of accurate modeling of a multi-device multi-pollutant simultaneous removal process of the ultra-low emission system; accurately evaluating multi-pollutant emission reduction costs under different loads, coal qualities, pollutant concentrations and operating parameters through a global operating cost evaluation method of the ultra-low emission system; realizing minute-level planning and optimization of emission reductions of a global pollutant emission reduction device under different emission targets through a multi-pollutant, multi-target and multi-condition global operating optimization method; and guaranteeing reliable emission reduction and margin control of the pollutants through an advanced control method for reliable up-to-standard ultra-low emission of the pollutants. According to the present invention, by deeply mining the multi-device multi-pollutant simultaneous removal mechanism of the ultra-low emission system and combining operating data and a global optimization algorithm, the energy-saving and consumption reduction potential of the ultra-low emission system is brought into full play under the precondition that efficient pollutant removal is guaranteed, and the difficulties of complicated system modeling and cost evaluation under multi-condition, multi-pollutant, multi-device and multi-parameter circumferences, multi-target optimization of multi-input multi-output devices and control of large-delay, nonlinear and wide-range load-variable devices are overcome, so that the controllability and adjustability of the system are improved, and efficient, reliable and economical operation of ultra-low emission systems is realized.

Accurate modeling of the multi-device multi-pollutant simultaneous removal process of the ultra-low emission system includes accurate prediction of a multi-pollutant generation process, accurate modeling of a multi-pollutant simultaneous removal process of a desulfurization system, accurate modeling of a multi-pollutant simultaneous removal and transformation process of a denitration system, and accurate modeling of a multi-pollutant removal process of a precipitation system.

Accurate prediction of the multi-pollutant generation process: a boiler operating database and a multi-pollutant outlet concentration database under different conditions and variable coal qualities are established by acquiring long-term operating data of a boiler and a pollutant continuous emission monitoring system (CEMS) and combining coal quality detection data and test reports of multiple pollutants including $NO_x$, $SO_2$, $SO_3$, PM and Hg; and a model for describing a corresponding relationship of boiler parameters and coal quality parameters with the concentrations of the multiple pollutants at a boiler outlet under different coal qualities and loads is established based on the boiler operating database and the multi-pollutant outlet concentration database.

Accurate modeling of the multi-pollutant simultaneous removal process of the desulfurization system: based on the generation, migration and transformation mechanism of the multiple pollutant as well as the removal mechanism of the multiple pollutants in the desulfurization system, a corresponding relationship of inlet $SO_2$ concentration, inlet flue gas temperature, liquid-gas ratio, slurry density and pH with outlet $SO_2$ concentration of the desulfurization system, a corresponding relationship of inlet $SO_3$ concentration, inlet $SO_2$ concentration, inlet dust content, inlet flue gas temperature, liquid-gas ratio and flue gas velocity with outlet $SO_3$ concentration of the desulfurization system, and a corresponding relationship of inlet Hg concentration, inlet dust content, load, flue gas velocity and inlet flue gas temperature with outlet Hg concentration are established according to coal quality, boiler operating parameters and inlet flue gas parameters of the desulfurization system, and then a model for accurately describing the multi-pollutant simultaneous removal process of the desulfurization system is obtained.

Accurate modeling of the multi-pollutant simultaneous removal and transformation process of the denitration system: based on the operating mechanism of an SCR denitration system, a corresponding relationship of inlet $NO_x$ concentration, flue gas parameters, reaction condition and reducer supply with outlet $NO_x$ concentration of the denitration system, a corresponding relationship of inlet $SO_2$ concentration, flue gas parameters, reaction condition and reducer supply with $SO_2$-to-$SO_3$ transformation rate in the denitration system, and a corresponding relationship of inlet Hg concentration, flue gas parameters, reaction condition and reducer supply with transformation ratio of particulate mercury ($Hg^P$), mercury oxides ($Hg^{2+}$ and $Hg^+$) and elementary mercury)($Hg^0$) in the denitration system are established by combining inlet flue gas parameters, online detection results of the CEMS and operating parameter historical data of the denitration system; then, a model for accurately describing the multi-pollutant simultaneous removal and transformation process of the denitration system under different conditions and operating parameters is obtained based on these corresponding relationships.

Accurate modeling of the multi-pollutant removal process of the precipitation system: based on the particulate matter removal mechanism of an electrostatic precipitation system, a corresponding relationship of coal quality, load, flue gas temperature, flue gas rate, operating voltage and outlet particulate matter concentration of a dry electric precipitator, a corresponding relationship of coal quality, load, flue gas temperature, flue gas rate, theoretical $SO_3$ concentration of the denitration system, operating voltage and outlet $SO_3$ concentration of the dry electric precipitator, a corresponding relationship of coal quality, load, flue gas temperature, flue gas rate, theoretical Hg concentration of the denitration system and outlet Hg concentration of the dry electric precipitator, a corresponding relationship of coal quality, load, flue gas temperature, flue gas rate, circulating water quantity, operating voltage and outlet particulate matter concentration of a wet electric precipitator, a corresponding relationship of coal quality, load, flue gas temperature, flue gas rate, inlet $NO_x$ concentration, circulating water quantity, circulating water pH, operating voltage and outlet $NO_x$ concentration of the wet electric precipitator, a corresponding relationship of coal quality, load, flue gas temperature, flue gas rate, inlet $SO_2$ concentration, circulating water quantity, circulating water pH, operating voltage and outlet $SO_2$ concentration of the wet electric precipitator, a corresponding relationship of coal quality, load, flue gas temperature, flue gas rate, inlet $SO_3$ concentration, circulating water quantity, circulating water pH, operating voltage and outlet $SO_3$ concentration of the wet electric precipitator, and a corresponding relationship of coal quality, load, flue gas temperature, flue gas rate, inlet Hg concentration, circulating water quantity, circulating water pH, operating voltage and outlet Hg concentration of the wet electric precipitator are established by combining coal quality, boiler operating parameters, inlet flue gas parameters of the electrostatic precipitation system, and historical operating data; then, a model for accurately describing the multi-pollutant simultaneous removal process of the precipitation system is obtained.

Preferably, accurate prediction of the multi-pollutant generation process refers to accurate prediction of the concentration of multiple pollutants, including $NO_x$, $SO_2$, $SO_3$, PM and Hg at the boiler outlet according to real-time boiler operating data and periodically-updated coal quality reports.

A boiler model is established through the following steps:

S101: collecting boiler parameters, coal quality parameters and a boiler outlet test report;

S102: collecting long-term operating historical data including boiler coal feed, flue gas, water, and boiler outlet pollutant concentrations detected by the CEMS;

S103: marking out typical boiler load intervals (100%, 75%, 50%, etc.) according to the test report and online operating data, and obtaining a corresponding datasets of boiler operating parameters, coal qualities and outlet pollutant concentrations in the typical boiler load intervals;

S104: for pollutants, data of which is monitored online by the CEMS, obtaining a corresponding relationship of the boiler operating data and coal quality parameters with outlet pollutant concentrations through a data modeling method (a neural network algorithm is adopted in this embodiment), based on the datasets;

S105: for pollutants, data of which is not monitored online by the CEMS, obtaining a corresponding relationship of the boiler operating data and the coal quality parameters with outlet pollutant concentrations through a data modeling method (a neural network algorithm is adopted in this embodiment) according to coal quality data and the test report, based on the datasets; and S106: combining the model obtained in S104 and the model obtain in S105 to obtain a boiler-side multi-pollutant concentration prediction model.

Preferably, the model for accurately describing the multi-pollutant simultaneous removal process of the desulfurization system is obtained specifically through the following steps:

S201: collecting design parameters and test reports of all devices of the desulfurization system;

S202: collecting online operating historical data of the desulfurization system, including boiler load, inlet flue gas parameters, flue gas rate, pH, liquid-gas ratio, slurry density, and inlet concentration and outlet concentrations;

S203: marking out typical load intervals and pollutant concentration intervals according to data distribution, and obtaining corresponding datasets of boiler loads, coal qualities and outlet pollutant concentrations in the typical boiler load intervals and the pollutant concentration intervals;

S204: based on the datasets, establishing an $SO_2$ removal mechanism model in the typical boiler load intervals and the pollutant concentration intervals according to the SO₂ removal mechanism of a desulfurization tower, and correcting the model according to historical data to obtain corresponding relationships of inlet SO₂ concentration, inlet flue gas parameters, liquid-gas ratio, slurry density and pH with outlet SO₂ concentration in the typical boiler load intervals and the pollutant concentration intervals;

S205: based on the datasets, obtaining corresponding relationships of inlet SO₃ concentration, inlet SO₂ concentration, inlet dust content, inlet flue gas temperature, liquid-gas ratio and flue gas velocity with outlet SO₃ concentration of the desulfurization system and corresponding relationships of inlet Hg concentration, inlet dust content, load, flue gas velocity and inlet flue gas temperature with outlet Hg concentration in the typical boiler load intervals and the pollutant concentration intervals through a data modeling method according to results of the test reports; and S206: based on these corresponding relationships, obtaining the model for accurately describing the multi-pollutant simultaneous removal and transformation process of the desulfurization system under different conditions and operating parameters.

The model for accurately describing the multi-pollutant simultaneous removal and transformation process of the denitration system is established specifically through the following steps:

S301: collecting design parameters of a denitration device, catalyst parameters, a catalyst test report, and a reducer test report;

S302: collecting historical data having an influence on online operation of the denitration device, including boiler load, operating temperature, flue gas rate, reducer supply, and inlet and outlet pollutant concentrations detected by the CEMS;

S303: marking out typical load intervals and pollutant concentration intervals according to data distribution, and obtaining corresponding datasets of boiler load, coal quality and outlet pollutant concentration in the typical boiler load intervals and the pollutant concentration intervals;

S304: based on the datasets, establishing a mechanism model of the denitration device in the typical boiler load intervals and the pollutant concentration intervals according to the NO$_x$ removal mechanism of the denitration system, and correcting the model according to the historical data to obtain corresponding relationships of inlet NO$_x$ concentration, flue gas parameter, reaction condition and reducer supply with the outlet NO$_x$ concentration of the denitration device, in the typical boiler load intervals and the pollutant concentration intervals;

S305: based on the datasets, obtaining corresponding relationships of inlet SO₂ concentration, flue gas parameters, reaction condition and reducer supply with the SO₂-to-SO₃ transformation rate in the denitration device, and corresponding relationships of inlet Hg concentration, flue gas parameters, reaction condition and reducer supply with the transformation rate of particulate mercury, mercury oxides and elementary mercury in the denitration system, in the typical boiler load interval and the pollutant concentration intervals according to results in the test reports through a data modeling method (a neural network algorithm is adopted in this embodiment); and S306: based on these corresponding relationships, obtaining the model for accurately describing the multi-pollutant simultaneous removal and transformation process of the denitration system under different conditions and operating parameters.

The model for accurately describing the multi-pollutant simultaneous removal process of the precipitation system is established specifically through the following steps:

S401: collecting design parameters and test reports of electrostatic precipitators;

S402: collecting historical data having an influence on online operation of the electrostatic precipitators, including boiler load, operating temperature, flue gas rate, secondary voltage, secondary current, and inlet and outlet pollutant concentrations detected by the CEMS;

S403: marking out typical load intervals and pollutant concentration intervals according to data distribution, and obtaining corresponding datasets of boiler loads, coal quality and outlet pollutant concentration in the typical boiler load intervals and the pollutant concentration intervals;

S404: based on the datasets, establishing PM removal mechanism models of the electrostatic precipitators in the typical boiler load intervals and the pollutant concentration intervals according to the PM removal mechanism of the electrostatic precipitators, and correcting the models by means of the historical data to obtain corresponding relationships of inlet PM concentration, flue gas parameter and operating voltage with the outlet PM concentration of the electrostatic precipitators, in the typical boiler intervals and the pollutant concentration intervals;

S405: based on the datasets, obtaining corresponding relationships of inlet SO₃ concentration, inlet PM concentration, boiler load, operating temperature, flue gas rate operating voltage and outlet SO₃ concentration and corresponding relationships of inlet Hg concentration, inlet PM concentration, boiler load, operating temperature, flue gas rate, operating voltage and outlet Hg concentration in the typical boiler load interval and the pollutant concentration interval through a data modeling method according to results of the test report; and S406: based on these corresponding relationships, obtaining the model for accurately describing the multi-pollutant simultaneous removal and transformation process of the precipitation system under different conditions and operating parameters.

Modeling of the SO₂ removal mechanism comprises:
Calculating the SO₂ removal rate:

$$\frac{dC_{SO_2}}{dt} = N_{SO_2} a$$

wherein, $dC_{SO_2}$ is a differential of the SO₂ molar concentration, dt is a time differential, and a is a gas-liquid mass transfer area per unit volume.

In a spray tower, the quantity of SO₂ removed from flue gas is equal to the quantity of SO₂ absorbed by slurry, and in case where the spray tower adopts an infinitesimal height dz, the following mass transfer equation is obtained:

$$K_{OG}a(y - y^*)dz = \frac{Gdy}{1-y}$$

Wherein, $K_{OG}$ is a total mass transfer coefficient of a gas phase and a liquid phase, kmol/(m²×s); a is a mass transfer area per unit volume, m²/m³; P is a total pressure, Pa; y is a molar fraction of $SO_2$ in the gas phase, y* is an equilibrium molar fraction of $SO_2$ in a gas film; G is a flue gas rate, kmol/(m²×s); dy is a differential of the molar fraction in the gas phase; Simplification of the desulfurization system: assume the flow rate in the vertical direction is constant and the total mass transfer coefficient is constant, an absorption height Z is obtained by integrating dz in the above equation:

$$Z = \frac{G}{K_G a P(1-y)_{LM}} \frac{y_1 - y_2}{\Delta y_m}$$

Wherein, $(1-y)_{LM}$ is the logarithmic mean values of $(1-y^*)$ and $(1-y)$, and the $SO_2$ absorption process in the desulfurization tower is approximate to 1; $\Delta y_m$ is an average thrust of the gas film of the desulfurization tower; $y_1$ is a molar fraction of an inlet gas phase; $y_2$ is a molar fraction of an outlet gas phase.

The basic form of the mechanism model is:

$$c_{out} = c_{in} * \exp(-NTU)$$

Wherein, $c_{out}$ and $c_{in}$ are respectively an inlet $SO_2$ concentration and an outlet $SO_2$ concentration, and NTU is the number of mass transfer elements, which refers to the difficulty level of an absorption tower to absorb $SO_2$ and is mathematically expressed as:

$$NTU = \frac{K_{OG} * a \cdot H}{G}$$

Parameters having an influence on NTU include: slurry pH, Ca/S ratio and gas-liquid ratio;

The total mass transfer coefficient of a spray region is:

$$\frac{1}{K_G} = \frac{1}{k_G} + \frac{H_{SO_2}}{E_{SO_2} k_L}$$

$$Sh = \frac{k_G d}{D_{SO_2}} = 2$$

$$Sc = \frac{\mu_g}{\rho_g D_{SO_2}}$$

$$Re_d = \frac{d|u_g - u_d|\rho_g}{u_g}$$

$$k_L = \sqrt{\frac{4 D_L}{\pi t_p}}$$

According to the unsteady-state penetration theory, $k_G$ is the absorptivity of the gas film, kmol/(m²·s·kPa); $\beta_{SO_2}$ is a chemical reaction enhancement factor; $k_L$ is the absorptivity of a liquid film, m/s; Sh is a dimensionless Sherwood number; $D_{SO_2}$ is a gas-phase diffusion coefficient of $SO_2$, m²/s; p is a total pressure in the tower, Pa; Sc is a Schmidt number; $M_{air}$ is the molar mass of air, g/mol; g/mol; $M_{SO_2}$ is the molar mass of $SO_2$, g/mol; $V_{air}$ is the molar volume of air, cm³/mol; $V_{SO_2}$ is the molar volume of $SO_2$, cm³/mol; $D_L$ is the diffusion coefficient of $SO_2$ in slurry, m²/s; $t_p$ is the penetration time, s.

Modeling of the particulate matter removal mechanism specifically comprises:

The grade efficiency $\eta_n(d_p, t)$ is defined as the ratio of the total amount of collected soot particles at moment t and scale $d_p$ to an initial amount:

$$\eta_n(d_p, t) = 1 - \frac{N_p(d_p, t)}{N_p(d_p, 0)} = 1 - \frac{\int_{d_p^-}^{d_p^+} n_p(d_p, t) dd_p}{N_p(d_p, 0)}$$

$d_p^-$ and $d_p^+$ respectively present an upper limit and a lower limit of a particle interval at scale $d_p$, and $N_p(d_p, t)$ represents the total amount of soot particles at scale $d_p$; $dd_p$ represents a differential of scale $d_p$, and $n_p(d_p, t)$ refers to the amount of correspondingly graded soot particles at moment t and scale $d_p$.

The following equations can be obtained by integrating the variable $d_p$:

$$\frac{dN_p(d_p, t)}{dt} = -\Lambda(d_p) N_p(d_p, t)$$

$$N_p(d_p, t) = N_p(d_p, 0) \exp(-\Lambda(d_p) \times t)$$

$\Lambda(d_p)$ is a deposition kernel (removal coefficient) which refers to the removal rate of particles at scale $d_p$ by slurry drops (unit: s−1) and is expressed as:

$$\Lambda(d_p) = \int_{D_{d,min}}^{D_{d,max}} K(d_p, D_p) E(d_p, D_p) n_p(D_p) dD_p$$

The relationship of the deposition kernel and the grade efficiency $\eta_m(d_p, t)$ is:

$$\eta_m(d_p, t) \approx \eta_n(d_p, t) = 1 - \exp(-\Lambda(d_p) \times t)$$

The overall grade efficiency $\eta_{total}(t)$ is defined as the ratio of the total mass of particles at all scales collected at moment t to an initial mass:

$$\eta_{total}(t) = 1 - \frac{\int_0^\infty \rho_p \pi \frac{d_p^3}{6} n_p(d_p, t) dd_p}{\int_0^\infty \rho_p \pi \frac{d_p^3}{6} n_p(d_p, 0) dd_p} = \frac{\int_0^\infty \eta_m(d_p, t) d_p^3 n_p(d_p, 0) dd_p}{\int_0^\infty d_p^3 n_p(d_p, 0) dd_p}$$

Wherein, $\rho_p$ refers to the density, and $n_p(d_p, 0)$ refers to the amount of correspondingly graded soot particles at the initial moment and scale $d_p$.

Preferably, by means of accurate modeling of the multi-pollutant removal and transformation process of the denitration system, real-time description of the dynamic transformation process of $NO_x$, $SO_2$, $SO_3$ and Hg and accurate prediction of the concentration are realized.

Preferably, during accurate modeling of the multi-pollutant simultaneous removal process of the desulfurization system, inlet flue gas parameters include inlet flue gas temperature, inlet $SO_2$ concentration, inlet $SO_3$ concentration, inlet particulate matter concentration (PM) and inlet Hg concentration, and outlet flue gas parameters include outlet flue gas temperature, outlet $SO_2$ concentration, outlet $SO_3$ concentration, outlet particulate matter (PM) concentration and outlet Hg concentration; the established mechanism models are corrected by coherent combination.

The form of coherent combination is as follows:

$$C_{SO_2, out} = f_{mechanism} + f_{data}$$

The influence of principal factors is mainly taken into consideration for the mechanism model, and the influence of secondary factors is taken into consideration for data correction.

Preferably, the global operating cost evaluation method of the ultra-low emission system specifically includes operating costs and fixed costs of all pollutant emission reduction systems.

Regarding to a limestone-gypsum wet desulphurization system, a total operating cost and a fixed cost are expressed as:

$$COST_{WFGD} = COST_{bf} + COST_{sa} + COST_{scp} + COST_{oab} + COST_{CaCO_3} + COST_{WFGD\_w} + R_{CaSO_4}$$

$$COST_{WFGD\_fix} = COST_{WFGD\_d} + COST_{WFGD\_r} + COST_{WFGD\_m}$$

Wherein, power consumption of booster fans $COST_{bf}$, power consumption of oxidization blowers $COST_{sa}$, power consumption of slurry circulating pumps $COST_{scp}$, power consumption of slurry agitators $COST_{oab}$, a limestone slurry cost $COST_{CaCO_3}$, a process water cost $COST_{WFGD\_w}$, a by-product gypsum revenue $R_{CaCO_4}$, a depreciation cost $COST_{WFGD\_d}$, a repair cost $COST_{WFGD\_r}$, and a manual cost $COST_{WFGD\_m}$ are included.

The operating cost of the desulfurization system includes energy consumption and material consumption, wherein the energy consumption is mainly generated by a motor of the desulfurization system and includes the power consumption of booster fans, the power consumption of oxidization blowers, the power consumption of slurry circulating pumps and the power consumption of the slurry agitators, and the costs are calculated as follows:

$$COST_{bf} = \frac{1}{q} \times \sqrt{3} \cos\varphi \left(\Sigma_{i=1}^{n_{bf}} I_i U_i\right) \times P_E \times \alpha_{WFGD}$$

$$COST_{sa} = \frac{1}{q} \times \sqrt{3} \cos\varphi \left(\sum_{i=1}^{n_{sa}} I_i U_i\right) \times P_E$$

$$COST_{scp} = \frac{1}{q} \times \sqrt{3} \cos\varphi \left(\sum_{i=1}^{n_{scp}} I_i U_i\right) \times P_E$$

$$COST_{oab} = \frac{1}{q} \times \sqrt{3} \cos\varphi \left(\sum_{i=1}^{n_{oab}} I_i U_i\right) \times P_E$$

Wherein, q is a real-time boiler load, $n_{bf}, n_{sa}, n_{scp}$ and $n_{oab}$ respectively represent the number of booster fans in operation, the number of oxidization fans in operation, the number of slurry circulating pumps in operation and the number of slurry agitators in operation, $U_i$ and $I_i$ respectively represent the voltage and current of the $i^{th}$ facility, $\cos\varphi$ is a power factor and is generally 0.8, and $P_E$ is the electricity price; $\alpha_{WFGD}$ is the ratio of the resistance of the desulfurization tower to the total resistance of a second half of ultra-low emission system and is calculated as follows:

$$\alpha_{WFGD} = \frac{p_{dt}}{p_{dt} + p_{WESP} + p_{gd2}}$$

Wherein, $p_{dt}$ is a pressure drop of the desulfurization tower, $p_{WESP}$ is a pressure drop of the wet electrostatic precipitator under resistance, and $p_{gd2}$ is a pressure drop of a gas duct under resistance.

Material consumption of the desulfurization system includes limestone consumption and process water consumption, a desulfurization absorber adopted by the limestone-gypsum wet desulphurization system is limestone slurry, and in accordance with material balance, the cost, namely limestone consumption, of power generation per unit is calculated as follows:

$$COST_{CaCO_3} = \frac{1}{q} \times (c_{SO_2\_in} - c_{SO_2\_out}) \times V \times \frac{M_{CaCO_3}}{M_{SO_2}} \times \frac{\delta_1}{\lambda} \times P_{CaCO_3}$$

Wherein, $c_{SO_2\_in}$ and $c_{SO_2\_out}$ respectively represent $SO_2$ concentrations of inlet flue gas and outlet flue gas of the desulfurization system, $M_{CaCO_3}$ and $M_{SO_2}$ respectively represent molecular weights of $CaCO_3$ and $SO_2$, $\lambda$ represents the purity of limestone, $P_{CaCO_3}$ represents the price of limestone, $\delta_1$ represents a calcium-sulfur ratio and is generally set to 1.02-1.05, and V represents the flue gas rate which is in a positive correlation with the boiler load and is calculated according to the following formula:

$$V = m \times q \times V_{tc}$$

Wherein, $V_{tc}$ is the amount of flue gas generated by coal per unit, and m is the coal quality.

The process water consumption is calculated as follows:

$$COST_{WFGD\_w} = \frac{1}{q} \times (c_{SO_2\_in} - c_{SO_2\_out}) \times V \times \frac{M_{CaCO_3}}{M_{SO_2}} \times \frac{\delta_1}{\lambda} \times \frac{2M_{H_2O}}{M_{CaCO_3}} \times P_w$$

Wherein, $M_{H_2O}$ is the molecular weight of water, and $P_w$ is the price of water.

Because gypsum is generated as a by-product when $SO_2$ in flue gas is removed, the gypsum, as revenue obtained in the operating process of the desulfurization system, is included in cost calculation of the limestone-gypsum wet desulfurization system, and the revenue is calculated as follows:

$$R_{CaCO_4} = \frac{1}{q} \times (c_{SO_2\_in} - c_{SO_2\_out}) \times V \times \frac{M_{CaCO_4}}{M_{SO_2}} \times P_{CaCO_4}$$

Wherein, $M_{CaSO_4}$ is the molecular weight of gypsum, and $P_{CaCO_4}$ is the price of gypsum.

The fixed cost of the desulfurization system includes the depreciation cost COSTWFGD_d, the repair cost COSTWFGD_r and the manual cost COSTWFGD_m which are respectively calculated as follows:

$$COST_{WFGD\_d} = \frac{1}{Q \times H} \times \frac{P_{WFGD\_init} \times \eta_{WFGD}}{Y_{WFGD}}$$

$$COST_{WFGD\_r} = \frac{1}{Q \times H} \times P_{WFGD\_init} \times \eta_{WFGD\_r}$$

$$COST_{WFGD\_m} = \frac{1}{Q \times H} \times \sum_{i=1}^{n_{WFGD}} S_{WFGD_i}$$

Wherein, Q is the capacity of a unit, H is annual operating hours of the unit, $P_{WFGD\_init}$ is an initial investment cost of the desulfurization system, $\eta_{WFGD}$ is a fixed assets formation rate of the desulfurization system, $Y_{WFGD}$ is a depreciable life of the desulfurization system, $\eta_{WFGD\_r}$ is the proportion of the repair cost of the desulfurization system to an investment cost, $n_{WFGD}$ is the total number of workers, and $S_{WFGD_i}$ is the annual salary of the $i^{th}$ worker of the desulfurization system.

Regarding to the SCR denitration system, a total operating cost and a fixed cost are expressed as follows:

$$COST_{SCR} = COST_{SCR\_idf} + COST_{sb} + COST_{adf} + COST_{NH_3} + COST_C$$

$$COST_{SCR\_fix} = COST_{SCR\_d} + COST_{SCR\_r} + COST_{SCR\_m}$$

The operating cost includes energy consumption and material consumption, and the energy consumption includes power consumption of induced draft fans, power consumption of soot blowers and power consumption of dilution fans, which are respectively calculated as follows:

$$COST_{SCR\_idf} = \frac{1}{q} \times \sqrt{3} \cos\varphi\left(\sum_{i=1}^{n_{idf}} I_i U_i\right) \times P_E \times \alpha_{SCR}$$

$$COST_{sb} = \begin{cases} \frac{P_{steam}}{CV_s} \times CV + \sum_{i=1}^{n_{sb}} P_i & \text{Steam blowing} \\ \frac{1}{6} \times \sum_{i=1}^{n_{sb}} P_i & \text{Acoustic blowing} \end{cases}$$

$$COST_{adf} = \frac{1}{q} \times \sqrt{3} \cos\varphi\left(\sum_{i=1}^{n_{adf}} I_i U_i\right) \times P_E$$

Wherein, $n_{idf}$, $n_{sb}$ and $n_{adf}$ are respectively the number of induced draft fans in operation, the number of soot blowers in operation and the number of dilution fans in operation, $P_{steam}$ is empirical steam consumption, $CV_s$ is empirical reference catalyst consumption, and $CV$ is actual catalyst consumption;

$\alpha_{SCR}$ represents the ratio of the resistance of a denitration reactor to the total resistance in the first half and is calculated as follows:

$$\alpha_{SCR} = \frac{p_{SCR}}{p_{idf}}$$

The material consumption of the denitration system includes a liquid ammonia cost and a catalyst cost, and in accordance with material balance, the liquid ammonia cost is calculated as follows:

$$COST_{NH_3} = \frac{1}{q} \times (c_{NO_x\_in} - c_{NO_x\_out}) \times V \times \frac{M_{NH_3}}{M_{NO}} \times \frac{2}{3} \times \frac{1}{\delta_2} \times \frac{ae \times M_{NH_3}}{V_m} \times P_{NH_3}$$

Wherein, $c_{NO_x\_in}$ and $C_{NO_x\_out}$ respectively represent $NO_x$ concentrations of inlet flue gas and outlet flue gas of the denitration system, $M_{NH_3}$ and $M_{NO}$ respectively represent molecular weights of $NH_3$ and $NO$, and $P_{NH_3}$ is the price of liquid ammonia.

The catalyst cost is calculated as follows:

$$COST_C = \frac{CV \times P_c}{3Qh}$$

Wherein, $P_c$ is the price of a catalyst, Q is the capacity of a unit, and h is the annual operating hours of the unit.

The fixed cost of the denitration system includes a depreciation cost $COST_{SCR\_d}$, a repair cost $COST_{SCR\_r}$ and a manual cost $COST_{SCR\_m}$, which are respectively calculated as follows:

$$COST_{SCR\_d} = \frac{1}{Q \times H} \times \frac{P_{SCR\_init} \times \eta_{SCR}}{Y_{SCR}}$$

$$COST_{SCR\_r} = \frac{1}{Q \times H} \times P_{SCR\_init} \times \eta_{SCR\_r}$$

$$COST_{SCR\_m} = \frac{1}{Q \times H} \times \sum_{i=1}^{n_{SCR}} S_{SCR_i}$$

Wherein, $P_{SCR\_init}$ is an initial investment cost of the denitration system, $\eta_{SCR}$ is a fixed assets formation rate of the denitration system, $Y_{SCR}$ is a depreciable life of the denitration system, $\eta_{SCR\_r}$ is the proportion of the repair cost of the denitration system to the investment cost, $n_{SCR}$ is the total number of workers of the denitration system, and $S_{SCR_i}$ is the annual salary of the $i^{th}$ worker.

Regarding to electrostatic precipitation systems, total operating costs and fixed costs of a dry electrostatic precipitation system and a wet electrostatic precipitation system are respectively expressed as follows:

$$COST_{ESP} = COST_{ESP\_idf} + COST_{ESP\_e}$$

$$COST_{ESP\_fix} = COST_{ESP\_d} + COST_{ESP\_r} + COST_{ESP\_m}$$

$$COST_{WESP} = COST_{WESP\_idf} + COST_{WESP\_e} + COST_{WESP\_w} + COST_{Na} + COST_{wc}$$

$$COST_{WESP\_fix} = COST_{WESP\_d} + COST_{WESP\_r} + COST_{WESP\_m}$$

The operating costs include power consumption.

Power consumption of a dry electrostatic precipitator includes power consumption of induced draft fans and power consumption of power supplies, which are respectively calculated as follows:

$$COST_{ESP\_idf} = \frac{1}{q} \times \sqrt{3} \cos\varphi\left(\sum_{i=1}^{n_{idf}} I_i U_i\right) \times P_E \times \alpha_{ESP}$$

$$COST_{ESP\_e} = \frac{1}{q} \times \sqrt{3} \cos\varphi\left(\sum_{i=1}^{n_e} I_i U_i\right) \times P_E$$

Wherein, $n_e$ is the number of electric fields, and $\alpha_{ESP}$ is the proportion of the resistance of the dry electrostatic precipitator to the total resistance in the first half and is calculated as follows:

$$\alpha_{ESP} = \frac{p_{ESP}}{p_{idf}}$$

Power consumption of a wet electrostatic precipitator includes power consumption of induced draft fans, power consumption of power supplies, a power cost and a material cost, and the power consumption of induced draft fans of the wet electrostatic precipitator is calculated as follows:

$$COST_{WESP\_idf} = \frac{1}{q} \times \sqrt{3} \cos\varphi(\Sigma_{i=1}^{n_{idf}} I_i U_i) \times P_E \times \alpha_{WESP}$$

$$\alpha_{WESP} = \frac{p_{WESP}}{p_{idf}}$$

The power consumption of power supplies of the wet electrostatic precipitator is:

$$COST_{WESP\_e} = \frac{1}{q} \times \sqrt{3} \cos\varphi(\Sigma_{i=1}^{n_e} I_i U_i) \times P_E$$

Compared with the dry electrostatic precipitator, the wet electrostatic precipitator has the power cost and the material cost, and the power cost mainly refers to power consumption of a water circulation system;

$$COST_{wc} = \frac{1}{q} \times \sqrt{3} \cos\varphi(\Sigma_{i=1}^{n_{wc}} I_i U_i) \times P_E$$

The material cost of the wet electrostatic precipitator includes a process water cost and an alkali consumption cost, which are calculated as follows:

$$COST_{WESP\_w} = \frac{1}{q} \times w \times P_w$$

$$COST_{Na} = \frac{1}{q} \times Na \times P_{Na}$$

The fixed costs of the dry electrostatic precipitation system and the wet electrostatic precipitation system include depreciation costs $COST_{ESP\_d}$ and $COST_{WESP\_d}$, repair costs $COST_{ESP\_r}$ and $COST_{WESP\_r}$, and manual costs $COST_{ESP\_m}$ and $COST_{WESP\_m}$, which are respectively calculated as follows:

$$COST_{ESP\_d} = \frac{1}{Q \times H} \times \frac{P_{WESP\_init} \times \eta_{ESP}}{Y_{ESP}}$$

$$COST_{WESP\_d} = \frac{1}{Q \times H} \times \frac{P_{WESP\_init} \times \eta_{WESP}}{Y_{WESP}}$$

$$COST_{ESP\_r} = \frac{1}{Q \times H} \times P_{ESP\_init} \times \eta_{ESP\_r}$$

$$COST_{WESP\_r} = \frac{1}{Q \times H} \times P_{WESP\_init} \times \eta_{WESP\_r}$$

$$COST_{ESP\_m} = \frac{1}{Q \times H} \times \sum_{i=1}^{n_{ESP}} S_{ESP_i}$$

$$COST_{WESP\_m} = \frac{1}{Q \times H} \times \sum_{i=1}^{n_{WESP}} S_{WESP_i}$$

Wherein, $P_{ESP\_init}$ and $P_{WESP\_init}$ respectively represent initial investment costs of the dry electrostatic precipitation system and the wet electrostatic precipitation system, $\eta_{ESP}$ and $\eta_{WESP}$ respectively represent fixed assets formation rates of the dry electrostatic precipitation system and the wet electrostatic precipitation system, $Y_{ESP}$ and $Y_{WESP}$ respectively represent a depreciable life of the dry electrostatic precipitation system and a depreciable life of the wet electrostatic precipitation system, $\eta_{ESP\_r}$ and $\eta_{WESP\_r}$ respectively represent the ratio of the repair cost of the dry electrostatic precipitation system to the investment cost and the ratio of the repair cost of the wet electrostatic precipitation system to the investment cost, $n_{ESP}$ and $n_{WESP}$ respectively represent the total number of workers of the dry electrostatic precipitation system, and $S_{ESP_i}$ and $S_{WESP_i}$ respectively represent the annual salary of the $i^{th}$ worker of the dry electrostatic precipitation system.

Figure 6:
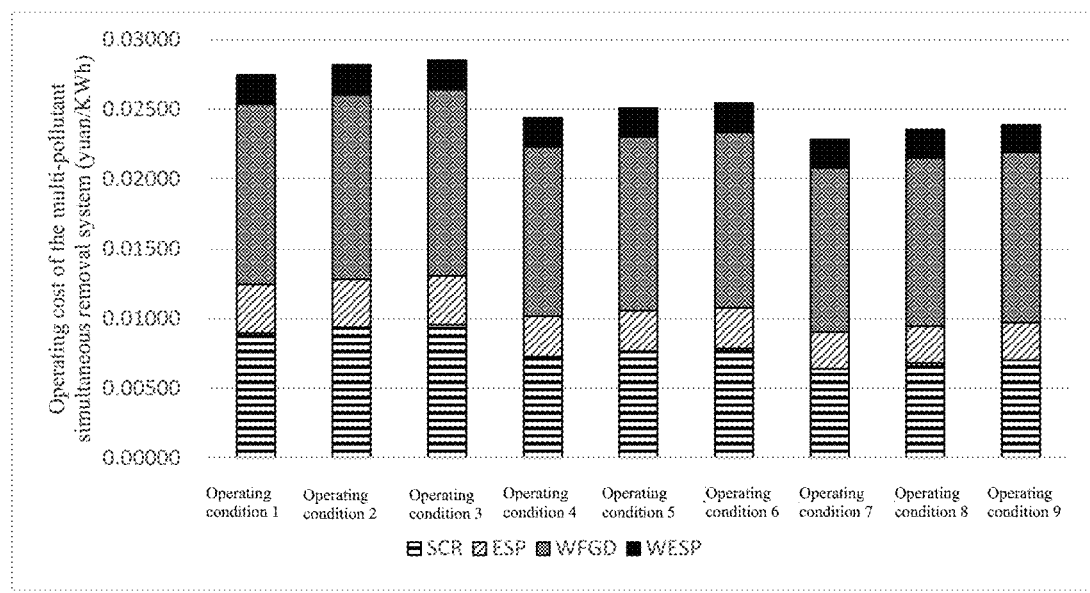
FIG. 6 is a first graph of the operating cost composition of the intelligent multi-pollutant ultra-low emission system under different conditions of the invention.

FIG. 6 and FIG. 7 illustrate operating cost compositions of the intelligent multi-pollutant ultra-low emission system under different conditions. Under different loads and different pollutant concentrations, the proportions of operating costs of all the systems to the overall operating cost of the intelligent multi-pollutant ultra-low emission system hardly change. Wherein, the proportion of the operating cost of the wet desulfurization system is the largest and is about 50% of the overall operating cost of the intelligent multi-pollutant ultra-low emission system, and the proportion of the operating cost of the denitration system to the overall operating cost of the intelligent multi-pollutant ultra-low emission system is about 30%. The proportions of the operating costs of the dry electrostatic precipitation system and the wet electrostatic precipitation system are almost the same and are about 10% to the overall operating cost of the intelligent multi-pollutant ultra-low emission system.

According to the invention, under high load and high pollutant concentration conditions, after pollutants are removed by the intelligent multi-pollutant ultra-low emission system, the actual concentration of $NO_x$ is 250 mg/m$^3$, the actual concentration of PM is 15356.6 mg/m$^3$, and the actual concentration of $SO_2$ is 1200 mg/m$^3$. The concentration of $NO_x$ is decreased to about 40 mg/m$^3$ by the SCR system and is further decreased to be less than 35 mg/m$^3$ under the simultaneous removal effect of the WFGD system. Most PM is removed by the ESP system which has a PM removal rate over 99%, the PM concentration at an outlet of the ESP system is only 12.07 mg/m$^3$, and the PM concentration of flue gas is controlled to 1.25 mg/m$^3$ under the removal effect of the WFGD system and the WESP system. Most $SO_2$ is removed by the WFGD system, the $SO_2$ concentration will be less than 20 mg/m$^3$ after the flue gas flows through the WFGD system, and afterwards, the $SO_2$ concentration is controlled to 12.69 mg/m$^3$ under the simultaneous removal effect of the WESP system.

Based on accurate modeling of the multi-device multi-pollutant simultaneous removal process and global operating cost evaluation, the multi-pollutant, multi-target and multi-condition global operating optimization method is applied to the typical intelligent multi-pollutant ultra-low emission system constituted by the SCR denitration system, the dry electrostatic precipitation (ESP) system, the wet flue gas desulphurization (WFGD) system and the wet electrostatic precipitation (WESP) system to realize minute-level planning and optimization of emission reductions of a global pollutant emission reduction device under different emission targets through sub-disciplinary decomposition of different pollutants and global and local swarm intelligence algorithms by means of the simultaneous removal effect of the devices on the pollutants and the mutual inter-coupling and competition relationship of the pollutants.

$NO_x$ is not only subjected to an SCR reaction in the SCR denitration device, but also is absorbed by the desulfurization system, and main reactions are as follows:

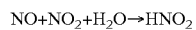

Residual SO$_2$ that is not removed by a limestone-gypsum wet desulphurization device can be removed along with the flowing of a washing solution when flue gas flows through the wet electrostatic precipitator. Residual PM that is not removed by the dry electrostatic precipitator and the wet electrostatic precipitator will be removed under the washing effect of slurry in the desulfurization tower.

According to the invention, a disperse policy decision method based on a collaborative optimization algorithm is used as a solution to multi-model optimization of the operation of the complicated intelligent multi-pollutant ultra-low emission system in a coal-fired power plant and has high system autonomy and good adaptability, and the models are resolved independently and have to be repeatedly coordinated to guarantee the consistency of decision results, which causes some communication costs, but the decision results are optimal because the solution process is carried out based on optimal solutions of the models.

Figure 4:
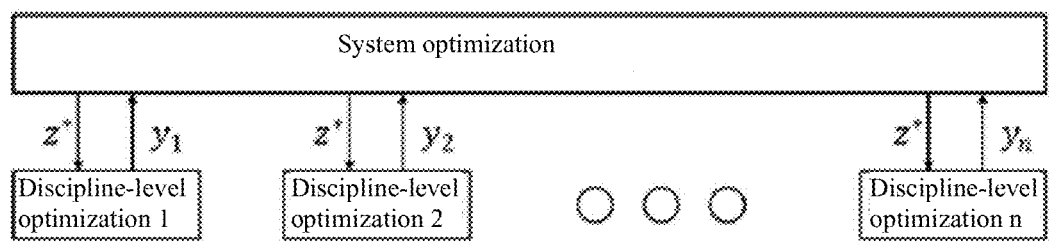
FIG. 4 is a schematic diagram of the optimization process of a collaborative optimization algorithm of the invention.

Referring to FIG. 4, according to the collaborative optimization algorithm, expected values of coupling variables are transmitted from a system level to discipline levels at first, and under the condition of meeting corresponding constraints, the discipline levels are separately optimized to make optimization results closest to the expected values provided by the system level; then, the optimization results are transmitted to the system level; after receiving the optimization results of the discipline levels, the system level coordinates the coupling variables and generates new expected values of the coupling variables; the new expected values are transmitted to the discipline levels again; a feasible solution that makes the coupling variables consistent and meets optimization targets is finally obtained through repeated iterations between the system level and the discipline levels.

Figure 5:
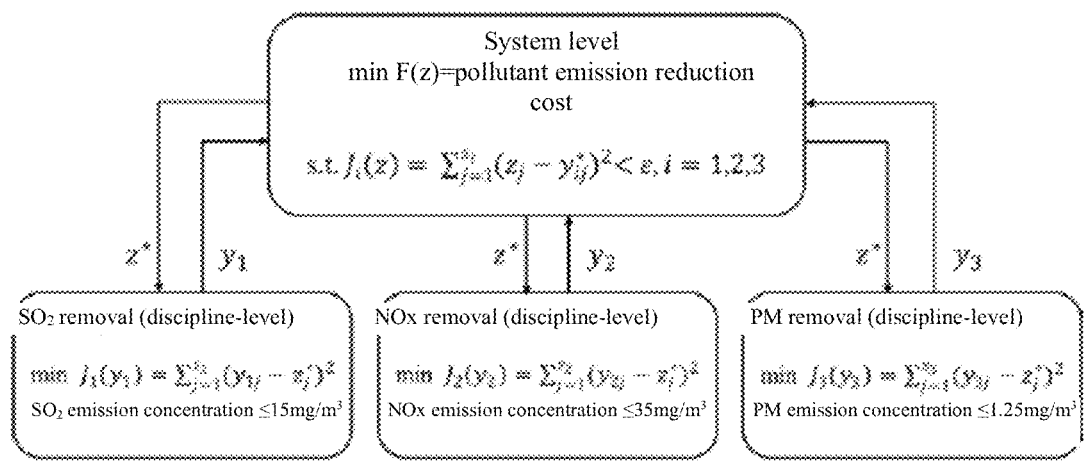
FIG. 5 is a framework diagram of the collaborative optimization algorithm of the invention.

Referring to FIG. 5, in the invention, according to different pollutants, a problem is decomposed into three sub-disciplines to be separately optimized, the target of system-level optimization is to minimize the total cost of pollutant emission reduction, and the constraint of the system-level optimization is that the differences between coupling variables of the sub-disciplines and system-level expected values are smaller than corresponding relaxation factors; the target of discipline-level optimization is to minimize the differences between the minimum coupling variables of the sub-disciplines and the system-level expected values, and the constraint of the discipline-level optimization is that emission concentrations of pollutants are lower than emission limits of the corresponding pollutants.

System-level and discipline-level optimization problems are resolved by a particle swarm algorithm which has a high convergence rate and a wide application range.

Design variables of the discipline-level optimization problems include a coupling variable y and an uncoupling variable x, and the optimization problems are expressed as:

$$\min J_i(\gamma_1) = \sum_{j=1}^{s_i}(\gamma_{ij}-z_j^*)^2, i=1,2,\ldots,n$$

$$s.t. g_i(x_i, y_i) \leq 0$$

Wherein, $y_{ij}$ represents the $j^{th}$ coupling variable of the $i^{th}$ sub-discipline, $z_j^*$ represents an expected value of the $j^{th}$ variable allocated to the sub-discipline by the system level, $s_i$ represents the number of coupling variables of the $i^{th}$ sub-discipline, n represents the number of the sub-disciplines, $x_i$ represents an uncoupling variable of the $i^{th}$ sub-discipline, and $g_i$ represents a constraint condition of the $i^{th}$ sub-discipline.

Design variables of the system-level optimization problem include a coupling variable z and an uncoupling variable w, and the optimization problem is expressed as:

$$\min F(z,w)$$

$$s.t. \sum_{j=1}^{s_i}(z_j-y_{ij}^*)^2 < \varepsilon, i=1,2,\ldots,n$$

Wherein, F represents a system-level target function, $z_j$ represents the $j^{th}$ coupling variable of the system level, $y_{ij}^*$ represents an optimization result of the $j^{th}$ coupling variable of the $i^{th}$ sub-discipline, and $\varepsilon$ is a relaxation factor.

By adoption of a dynamic relaxation factor, the optimization conditions can be met, and the optimal solution can be resolved at a high convergence rate. At the initial optimization stage, a large initial value is assigned to the relaxation factor to define a large feasible region to guarantee the existence of a feasible solution. With the continuation of iteration, the relaxation factor is decreased to narrow down the feasible region to further improve the consistency of the coupling variables.

If the optimal solution of the $i^{th}$ sub-discipline during $k^{th}$ iteration $x_i^{*(k)}$, $y_i^{*(k)}$ the maximum difference D between the sub-disciplines is defined as $D = \max\|y_i^{*(k)} - y_j^{*(k)}\|, i,j = 1,2,\ldots,n$. If the optimal system-level solution during $(k-1)^{th}$ iteration is $z_i^{*(k-1)}$, $w_i^{*(k-1)}$, a collaborative difference $P_i$ is defined as $P_i^k = \|z_i^{*(k-1)} - y_i^{*(k)}\|$, and the relaxation factor $\varepsilon_i^k$ of the $i^{th}$ sub-discipline during $k^{th}$ iteration is $\varepsilon_i^k = (\lambda_i^k D)^2 + d$, wherein d is a minimum positive number to guarantee the relaxation effect, and $\lambda_i^k$ is defined as $\lambda_i^k = 0.5*(1-a^{P_i})$, $0 \leq a \leq 1$.

Based on the RBT neural network models adopted in the pollutant removal process, the maximum iterations between the system level and the discipline level of the collaborative optimization algorithm is set to 50, the maximum iterations of the particle swarm algorithm is set to 50, and the number of particles is set to 100 to optimize the operating condition under a typical load and a typical inlet concentration.

According to the advanced control method for reliable up-to-standard ultra-low emission of the pollutants, dynamic property response models of manipulated variables and disturbance parameters of the pollutant removal devices to pollutant removal are established based on real-time data, and under the condition of set emission reduction values of the devices, control variables of the pollutant removal devices are optimized and controlled in real time through a model prediction and control method; the dynamic property response models are updated online to better adapt to large-delay, non-linearity and variable-load characteristics of the system, and even if system parameters change, margin control of pollutant emission can be realized, and pollutant removal costs are further reduced in case of changes to the system.

During global optimization, the set emission reduction values of the devices will be given to the control system, the control system will set each set value as an input variable, and the pollutant removal control effect should be close to the set values as much as possible. A dynamic property response model of manipulated variables and disturbance parameters of the pollutant removal devices to pollutant removal is established based on real-time data, and the model has nine sub-models for load increase, load decrease and load maintaining under high, medium and small load conditions, and in different load change stages, different sub-models are used to optimize and control variables of the pollutant removal devices through a model prediction control method. The dynamic property response model will be updated every period of time to ensure that operation parameters can be controlled when the removal model changes actually. Considering the properties of the desulfurization system, the model of the denitration system will be updated every one hour, the model of the desulfurization system will be updated every one, and the model the precipitation system will be updated every ten minutes.

By adoption of the above solutions, the invention can realize simultaneous removal of multiple flue gas pollutants by means of the key devices of the intelligent multi-pollutant ultra-low emission system, on the basis of existing ultra-low emission systems, improve the simultaneous removal effect of multiple pollutants such as nitrogen oxide, sulfur oxide, particulate matter and mercury, effectively improve the multi-pollutant efficient removal effect of flue gas emission reduction devices, greatly reduce operating costs, and improve the operating adaptability under different conditions.

What is claimed is:

1. A computer-implemented method for controlling simultaneous removal of multi-pollutant including nitrogen oxide ($NO_x$), sulfur oxide ($SO_2$ and $SO_3$), particulate matter (PM) and mercury (Hg), comprising:
   (a) modeling of a multi-device multi-pollutant simultaneous removal process of an emission system by including prediction of a multi-pollutant generation process, modeling of a multi-pollutant simultaneous removal process of a desulfurization system, modeling of a multi-pollutant simultaneous removal and transformation process of a denitration system, and modeling of a multi-pollutant removal process of a precipitation system;
   (b) evaluating multi-pollutant emission reduction costs under a plurality of loads, coal qualities, pollutant concentrations and operating parameters through a global operating cost evaluation method of the ultra-low emission system;
   (c) realizing minute-level planning and optimization of emission reductions of a global pollutant emission reduction device under different emission targets through a multi-pollutant, multi-target and multi-condition global operating optimization method; and
   (d) removing multi-pollutant simultaneously according to a predetermined emission standard of the multi-pollutant;
   wherein, in step (a), the prediction of the multi-pollutant generation process is as follows:
   establishing a boiler operating database and a multi-pollutant outlet concentration database under different conditions and variable coal qualities by acquiring long-term operating data of a boiler and a continuous emission monitoring system and combining coal quality detection data and test reports of the multiple pollutants including $NO_x$, $SO_2$, $SO_3$, PM and Hg; and
   establishing a model for describing a corresponding relationship of boiler parameters and coal quality parameters with the concentrations of the multiple pollutants at a boiler outlet under different coal qualities and loads, based on the boiler operating database and the multi-pollutant outlet concentration database through a data modeling method;
   wherein, in step (a), modeling of the multi-pollutant simultaneous removal process of the desulfurization system is as follows:
   a corresponding relationship of inlet $SO_2$ concentration, inlet flue gas temperature, liquid-gas ratio, slurry density and pH with outlet $SO_2$ concentration of the desulfurization system, a corresponding relationship of inlet $SO_3$ concentration, inlet $SO_2$ concentration, inlet dust content, inlet flue gas temperature, liquid-gas ratio and flue gas velocity with outlet $SO_3$ concentration of the desulfurization system, and a corresponding relationship of inlet Hg concentration, inlet dust content, load, flue gas velocity and inlet flue gas temperature with outlet Hg concentration are established by combining coal qualities, boiler operating parameters, inlet flue gas parameters of the desulfurization system, and operating parameter historical data of the desulfurization system, and then, a model for the multi-pollutant simultaneous removal process of the desulfurization system is obtained;
   wherein, in step (a), modeling of the multi-pollutant simultaneous removal and transformation process of the denitration system is as follows:
   based on an operating mechanism of a selective catalytic reduction (SCR) denitration system, a corresponding relationship of inlet $NO_x$ concentration, flue gas parameters, reaction condition and reducer supply with outlet $NO_x$ concentration of the denitration system a corresponding relationship of inlet $SO_2$ concentration, flue gas parameters, reaction condition and reducer supply with $SO_2$-to-$SO_3$ transformation rate in the denitration system, and a corresponding relationship of inlet Hg concentration, flue gas parameters, reaction condition and reducer supply with transformation ratio of particulate mercury, mercury oxides and elementary mercury in the denitration system are established by combining inlet flue gas parameters, online detection results of a pollutant continuous emission monitoring system (CEMS) and operating parameter historical data of the denitration system, and then, a model for describing the multi-pollutant simultaneous removal and transformation process of the denitration system under different conditions and operating parameters is obtained based on these corresponding relationships;
   wherein, in step (a), modeling of the multi-pollutant removal process of the precipitation system is as follows:
   based on a particulate matter removal mechanism of an electrostatic precipitation system, a corresponding relationship of coal quality, load, flue gas temperature, flue gas rate, operating voltage and outlet particulate matter concentration of a dry electric precipitator, a corresponding relationship of coal quality, load, flue gas temperature, flue gas rate, theoretical $SO_3$ concentration of the denitration system, operating voltage and outlet $SO_3$ concentration of the dry electric precipitator, a corresponding relationship of coal quality, load, flue gas temperature, flue gas rate, theoretical Hg concentration of the denitration system and outlet Hg concentration of the dry electric precipitator, a corresponding relationship of coal quality, load, flue gas temperature, flue gas rate, circulating water quantity, operating voltage and outlet particulate matter concentration of a wet electric precipitator, a corresponding relationship of coal quality, load, flue gas temperature, flue gas rate, inlet $NO_x$ concentration, circulating water quantity, circulating water pH, operating voltage and outlet $NO_x$ concentration of the wet electric precipitator, a corresponding relationship of coal quality, load, flue gas temperature, flue gas rate, inlet $SO_2$ concentration, circulating water quantity, circulating water pH, operating voltage and outlet $SO_2$ concentration of the wet electric precipitator, a corresponding relationship of coal quality, load, flue gas temperature, flue gas rate, inlet SO$_3$ concentration, circulating water quantity, circulating water pH, operating voltage and outlet SO$_3$ concentration of the wet electric precipitator, and a corresponding relationship of coal quality, load, flue gas temperature, flue gas rate, inlet Hg concentration, circulating water quantity, circulating water pH, operating voltage and outlet Hg concentration of the wet electric precipitator are established by combining coal quality, boiler operating parameters, inlet flue gas parameters of the electrostatic precipitation system, and historical operating data; then, a model for describing the multi-pollutant simultaneous removal process of the precipitation system is obtained;

wherein, in step (a), the prediction of the multi-pollutant generation process refers to prediction of the concentration of the multiple pollutants, including NO$_x$, SO$_2$, SO$_3$, PM and Hg at a boiler outlet according to real-time boiler operating data and periodically-updated coal quality reports;

a boiler model is established through the following steps:

S101: collecting boiler parameters, coal quality parameters and a boiler outlet test report;

S102: collecting long-term operating historical data including boiler coal feed, flue gas, water, and boiler outlet pollutant concentrations detected by the CEMS;

S103: marking out typical boiler load intervals according to the test report and online operating data, and obtaining corresponding datasets of boiler operating parameters, coal qualities and outlet pollutant concentrations in the typical boiler load intervals;

S104: for pollutants, data of which is monitored online by the CEMS, obtaining a corresponding relationship of the boiler operating data and coal quality parameters with outlet pollutant concentrations through a data modeling method, based on the datasets;

S105: for pollutants, data of which is not monitored online by the CEMS, obtaining a corresponding relationship of the boiler operating data and the coal quality parameters with outlet pollutant concentrations through a data modeling method according to coal quality data and the test report, based on the datasets; and S106: combining the model obtained in S104 and the model obtain in S105 to obtain the multi-pollutant concentration prediction model of the boiler;

wherein, in step (a), the model for describing the multi-pollutant simultaneous removal process of the desulfurization system is obtained specifically through the following steps:

S201: collecting design parameters and test reports of all devices of the desulfurization system;

S202: collecting online operating historical data of the desulfurization system, including boiler load, inlet flue gas parameters, flue gas rate, pH, liquid-gas ratio, slurry density, and inlet concentration and outlet concentrations;

S203: marking out typical load intervals and pollutant concentration intervals according to data distribution, and obtaining corresponding datasets of boiler loads, coal qualities and outlet pollutant concentrations in the typical boiler load intervals and the pollutant concentration intervals;

S204: based on the datasets, establishing an SO$_2$ removal mechanism model in the typical boiler load intervals and in the pollutant concentration intervals according to an SO$_2$ removal mechanism of a desulfurization tower, and correcting the model according to historical data to obtain corresponding relationships of inlet SO$_2$ concentration, inlet flue gas parameters, liquid-gas ratio, slurry density and pH with outlet SO$_2$ concentration in the typical boiler load intervals and the pollutant concentration intervals;

S205: based on the datasets, obtaining corresponding relationships of inlet SO$_3$ concentration, inlet SO$_2$ concentration, inlet dust content, inlet flue gas temperature, liquid-gas ratio and flue gas velocity with outlet SO$_3$ concentration of the desulfurization system and corresponding relationships of inlet Hg concentration, inlet dust content, load, flue gas velocity and inlet flue gas temperature with outlet Hg concentration, in the typical boiler load intervals and the pollutant concentration intervals through a data modeling method according to results of the test reports; and S206: based on these corresponding relationships, obtaining the model for describing the multi-pollutant simultaneous removal and transformation process of the desulfurization system under different conditions and operating parameters;

wherein, in step (a), the model for describing the multi-pollutant simultaneous removal and transformation process of the denitration system is established specifically through the following steps:

S301: collecting design parameters of a denitration device, catalyst parameters, a catalyst test report, and a reducer test report;

S302: collecting historical data having an influence on online operation of the denitration device, including boiler load, operating temperature, flue gas rate, reducer supply, and inlet and outlet pollutant concentrations detected by the CEMS;

S303: marking out typical load intervals and a pollutant concentration intervals according to data distribution, and obtaining corresponding datasets of boiler load, coal quality and outlet pollutant concentration in the typical boiler load intervals and the pollutant concentration intervals;

S304: based on the datasets, establishing a mechanism model of the denitration device in the typical boiler load intervals and the pollutant concentration intervals according to an NO$_x$ removal mechanism of the denitration system, and correcting the model according to the historical data to obtain corresponding relationships of inlet NO$_x$ concentration, flue gas parameter, reaction condition and reducer supply with the outlet NO$_x$ concentration of the denitration device, in the typical boiler load intervals and the pollutant concentration intervals;

S305: based on the datasets, obtaining corresponding relationships of inlet SO$_2$ concentration, flue gas parameters, reaction condition and reducer supply with the SO$_2$-to-SO$_3$ transformation rate in the denitration device, and corresponding relationships of inlet Hg concentration, flue gas parameters, reaction condition and reducer supply with the transformation rate of particulate mercury, mercury oxides and elementary mercury in the denitration system, in the typical boiler load intervals and the pollutant concentration intervals according to results in the test reports through a data modeling method; and S306: based on these corresponding relationships, obtaining the model for describing the multi-pollutant simultaneous removal and transformation process of the denitration system under different conditions and operating parameters;

wherein, in step (a), the model for describing the multi-pollutant simultaneous removal process of the precipitation system is established specifically through the following steps:

S401: collecting design parameters and test reports of electrostatic precipitators;

S402: collecting historical data having an influence on online operation of the electrostatic precipitators, including boiler load, operating temperature, flue gas rate, secondary voltage, secondary current, and inlet and outlet pollutant concentrations detected by the CEMS;

S403: marking out typical load intervals and pollutant concentration intervals according to data distribution, and obtaining corresponding datasets of boiler load, coal quality and outlet pollutant concentration in the typical boiler load intervals and the pollutant concentration intervals;

S404: based on the datasets, establishing PM removal mechanism models of the electrostatic precipitators in the typical boiler load intervals and the pollutant concentration intervals according to a PM removal mechanism of the electrostatic precipitators, and correcting the models by means of the historical data to obtain corresponding relationships of inlet PM concentration, flue gas parameter and operating voltage with the outlet PM concentration of the electrostatic precipitators, in the typical boiler intervals and the pollutant concentration intervals;

S405: based on the datasets, obtaining corresponding relationships of inlet $SO_3$ concentration, inlet PM concentration, boiler load, operating temperature, flue gas rate operating voltage and outlet $SO_3$ concentration and corresponding relationships of inlet Hg concentration, inlet PM concentration, boiler load, operating temperature, flue gas rate, operating voltage and outlet Hg concentration in the typical boiler load interval and the pollutant concentration interval through a data modeling method according to results of the test report; and S406: based on these corresponding relationships, obtaining the model for describing the multi-pollutant simultaneous removal and transformation process of the precipitation system under different conditions and operating parameters;

wherein by means of modeling of the multi-pollutant removal and transformation process of the denitration system, real-time description of a dynamic transformation process of $NO_x$, $SO_2$, $SO_3$ and Hg and prediction of the concentration are realized; during modeling of the multi-pollutant simultaneous removal process of the desulfurization system, inlet flue gas parameters include inlet flue gas temperature, inlet $SO_2$ concentration, inlet $SO_3$ concentration, inlet particulate matter concentration and inlet Hg concentration, and outlet flue gas parameters include outlet flue gas temperature, outlet $SO_2$ concentration, outlet $SO_3$ concentration, outlet particulate matter concentration and outlet Hg concentration; the established mechanism models are corrected by coherent combination;

wherein the global operating cost evaluation method of the ultra-low emission system specifically includes operating costs and fixed costs of all pollutant emission reduction systems;

regarding to a limestone-gypsum wet desulphurization system, a total operating cost and a fixed cost are expressed as:

$$COST_{WFGD} = COST_{bf} + COST_{sa} + COST_{scp} + COST_{oab} + COST_{CaCO_3} + COST_{WFGD\_w} - R_{CaSO_4}$$

$$COST_{WFGD\_fix} = COST_{WFGD\_d} + COST_{WFGD\_r} + COST_{WFGD\_m}$$

wherein, power consumption of booster fans $COST_{bf}$, power consumption of oxidization blowers $COST_{sa}$, power consumption of slurry circulating pumps $COST_{scp}$, power consumption of slurry agitators $COST_{oab}$, a limestone slurry cost $COST_{CaCO_3}$, a process water cost $COST_{WFGD\_w}$, a by-product gypsum revenue $R_{CaCO_4}$, a depreciation cost $COST_{WFGD\_d}$, a repair cost $COST_{WFGD\_r}$, and a manual cost $COST_{WFGD\_m}$ are included;

the operating cost of the desulfurization system includes energy consumption and material consumption, wherein the energy consumption is mainly generated by a motor of the desulfurization system and includes the power consumption of booster fans, the power consumption of oxidization blowers, the power consumption of slurry circulating pumps and the power consumption of the slurry agitators, and the cost are calculated as follows:

$$COST_{bf} = \frac{1}{q} \times \sqrt{3} \cos\varphi \left(\sum_{i=1}^{n_{bf}} I_i U_i\right) \times P_E \times \alpha_{WFGD}$$

$$COST_{sa} = \frac{1}{q} \times \sqrt{3} \cos\varphi \left(\sum_{i=1}^{n_{sa}} I_i U_i\right) \times P_E$$

$$COST_{scp} = \frac{1}{q} \times \sqrt{3} \cos\varphi \left(\sum_{i=1}^{n_{scp}} I_i U_i\right) \times P_E$$

$$COST_{oab} = \frac{1}{q} \times \sqrt{3} \cos\varphi \left(\sum_{i=1}^{n_{oab}} I_i U_i\right) \times P_E$$

wherein, q is a real-time boiler load, $n_{bf}$, $n_{sa}$, $n_{scp}$ and $n_{oab}$ respectively represent the number of booster fans in operation, the number of oxidization fans in operation, the number of slurry circulating pumps in operation and the number of slurry agitators in operation, $U_i$ and $I_i$ respectively represent the voltage and current of an $i^{th}$ facility, $\cos\varphi$ is a power factor, and $P_E$ is the electricity price;

$\alpha_{WFGD}$ is the ratio of the resistance of a desulfurization tower to the total resistance in a second half and is calculated as follows:

$$\alpha_{WFGD} = \frac{p_{dt}}{p_{dt} + p_{WESP} + p_{gd2}}$$

wherein, $p_{dt}$ is a pressure drop of the desulfurization tower, $p_{WESP}$ is a pressure drop of the wet electrostatic precipitator under resistance, and $p_{gd2}$ is a pressure drop of a gas duct under resistance;

material consumption of the desulfurization system includes limestone consumption and process water consumption, the limestone consumption is calculated as follows:

$$COST_{CaCO_3} = \frac{1}{q} \times (c_{SO_2\_in} - c_{SO_2\_out}) \times V \times \frac{M_{CaCO_3}}{M_{SO_2}} \times \frac{\delta_1}{\lambda} \times P_{CaCO_3}$$

wherein, $c_{SO_2\_in}$ and $c_{SO_2\_out}$ respectively represent $SO_2$ concentrations of inlet flue gas and outlet flue gas of the desulfurization system, $M_{CaCO_3}$ and $M_{SO_2}$ respectively represent molecular weights of $CaCO_3$ and $SO_2$, $\lambda$ represents the purity of limestone, $P_{CaCO_3}$ represents the price of limestone, $\delta_1$ represents a calcium-sulfur ratio, and V represents the flue gas rate which is in a positive correlation with the boiler load and is calculated according to the following formula:

$$V = m \times q \times V_{tc}$$

wherein, $V_{tc}$ is the amount of flue gas generated by coal per unit, and m is coal quality;

the process water consumption is calculated as follows:

$$COST_{WFGD\_w} = \frac{1}{q} \times (C_{SO_2\_in} - C_{SO_2\_out}) \times V \times \frac{M_{CaCO_3}}{M_{SO_2}} \times \frac{\delta_1}{\lambda} \times \frac{2M_{H_2O}}{M_{CaCO_3}} \times P_w$$

wherein, $M_{H_2O}$ s the molecular weight of water, and is the price of water;

gypsum, as revenue obtained in the operating process of the desulfurization system, is included in cost calculation of the limestone-gypsum wet desulfurization system, and the revenue is calculated as follows:

$$R_{CaSO_4} = \frac{1}{q} \times (C_{SO_2\_in} - C_{SO_2\_out}) \times V \times \frac{M_{CaSO_4}}{M_{SO_2}} \times P_{CaSO_4}$$

wherein, $M_{CaSO_4}$ is the molecular weight of gypsum, and $P_{CaSO_4}$ is the price of gypsum;

the fixed cost of the desulfurization system includes the depreciation cost $COST_{WFGD\_d}$, the repair cost $COST_{WFGD\_r}$ and the manual cost $COST_{WFGD\_m}$ which are respectively calculated as follows:

$$COST_{WFGD\_d} = \frac{1}{Q \times H} \times \frac{P_{WFGD\_init} \times \eta_{WFGD}}{Y_{WFGD}}$$

$$COST_{WFGD\_r} = \frac{1}{Q \times H} \times P_{WFGD\_init} \times \eta_{WFGD\_r}$$

$$COST_{WFGD\_m} = \frac{1}{Q \times H} \times \sum_{i=1}^{\eta_{WFGD}} S_{WFGD_i}$$

wherein, Q is the capacity of a unit, H is annual operating hours of the unit, $P_{WFGD\_init}$ s an initial investment cost of the desulfurization system, $\eta_{WFGD}$ is a fixed assets formation rate of the desulfurization system, $Y_{WFGD}$ is a depreciable life of the desulfurization system, $\eta_{WFGD\_r}$ is the proportion of the repair cost of the desulfurization system to an investment cost, $\eta_{WFGD}$ is the total number of workers, and $S_{WFGD_i}$ is the annual salary of an $i^{th}$ worker of the desulfurization system;

regarding to the SCR denitration system, a total operating cost and a fixed cost are expressed as follows:

$$COST_{SCR} = COST_{SCR\_idf} + COST_{sb} + COST_{adf} + COST_{NH_3} + COST_C$$

$$COST_{SCR\_fix} = COST_{SCR\_d} + COST_{SCR\_r} + COST_{SCR\_m}$$

the operating cost includes energy consumption and material consumption, and the energy consumption includes power consumption of induced draft fans, power consumption of soot blowers and power consumption of dilution fans, which are respectively calculated as follows:

$$COST_{SCR\_idf} = \frac{1}{q} \times \sqrt{3} \cos\varphi \left( \sum_{i=1}^{n_{idf}} I_i U_i \right) \times P_E \times \alpha_{SCR}$$

$$COST_{sb} = \begin{cases} \frac{P_{steam}}{CV_s} \times CV + \sum_{i=1}^{n_{sb}} P_i & \text{Steam blowing} \\ \frac{1}{6} \times \sum_{i=1}^{n_{sb}} & \text{Acoustic blowing} \end{cases}$$

$$COST_{adf} = \frac{1}{q} \times \sqrt{3} \cos\varphi \left( \sum_{i=1}^{n_{adf}} I_i U_i \right) \times P_E$$

wherein, $n_{idf}$, $n_{sb}$ and $n_{adf}$ are respectively the number of induced draft fans in operation, the number of soot blowers in operation and the number of dilution fans in operation, $P_{steam}$ is empirical steam consumption, $CV_s$ is empirical reference catalyst consumption, and CV is actual catalyst consumption;

$\alpha_{SCR}$ represents the ratio of the resistance of a denitration reactor to the total resistance in a first half and is calculated as follows:

$$\alpha_{SCR} = \frac{p_{SCR}}{p_{idf}}$$

the material consumption of the denitration system includes a liquid ammonia cost and a catalyst cost, the liquid ammonia cost is calculated as follows:

$$COST_{NH_3} = \frac{1}{q} \times (C_{NO_x\_in} - C_{NO_x\_out}) \times V \times \frac{M_{NH_3}}{M_{NO}} \times \frac{2}{3} \times \frac{1}{\delta_2} \times \frac{ae \times M_{NH_3}}{V_m} \times P_{NH_3}$$

wherein, $C_{NO_x\_in}$ and $C_{NO_x\_out}$ respectively represent $NO_x$ concentrations of inlet flue gas and outlet flue gas of the denitration system, $M_{NH_3}$ and $M_{NO}$ respectively represent molecular weights of $NH_3$ and NO, and $P_{NH_3}$ is the price of liquid ammonia;

the catalyst cost is calculated as follows:

$$COST_C = \frac{CV \times P_c}{3Qh}$$

wherein, $P_c$ is the price of a catalyst, Q is the capacity of a unit, and h is the annual operating hours of the unit;

the fixed cost of the denitration system includes a depreciation cost $COST_{SCR\_d}$, a repair cost $COST_{SCR\_r}$ and a manual cost $COST_{SCR\_m}$, which are respectively calculated as follows:

$$COST_{SCR\_d} = \frac{1}{Q \times H} \times \frac{P_{SCR\_init} \times \eta_{SCR}}{Y_{SCR}}$$

-continued $$COST_{SCR\_r} = \frac{1}{Q \times H} \times P_{SCR\_init} \times \eta_{SCR\_r}$$

$$COST_{SCR\_m} = \frac{1}{Q \times H} \times \sum_{i=1}^{n_{SCR}} S_{SCR_i}$$

wherein, $P_{SCR\_init}$ is an initial investment cost of the denitration system, $\eta_{SCR}$ is a fixed assets formation rate of the denitration system, $Y_{SCR}$ is a depreciable life of the denitration system, $\eta_{SCR\_r}$ is the proportion of the repair cost of the denitration system to the investment cost, $n_{SCR}$ is the total number of workers of the denitration system, $S_{SCR_i}$ is the annual salary of an $i^{th}$ worker;

regarding to electrostatic precipitation systems, total operating costs and fixed costs of a dry electrostatic precipitation system and a wet electrostatic precipitation system are respectively expressed as follows:

$COST_{ESP} = COST_{ESP\_idf} + COST_{ESP\_e}$ $COST_{ESP\_fix} = COST_{ESP\_d} + COST_{ESP\_r} + COST_{ESP\_m}$ $COST_{WESP} = COST_{WESP\_idf} + COST_{WESP\_e} + COST_{WESP\_w} + COST_{Na} + COST_{wc}$ $COST_{WESP\_fix} = COST_{WESP\_d} + COST_{WESP\_r} + COST_{WESP\_m}$ the operating costs include power consumption, power consumption of a dry electrostatic precipitator includes power consumption of induced draft fans and power consumption of power supplies, which are respectively calculated as follows:

$$COST_{ESP\_idf} = \frac{1}{q} \times \sqrt{3} \cos\varphi \left(\sum_{i=1}^{n_{idf}} I_i U_i\right) \times P_E \times \alpha_{ESP}$$

$$COST_{ESP\_e} = \frac{1}{q} \times \sqrt{3} \cos\varphi \left(\sum_{i=1}^{n_e} I_i U_i\right) \times P_E$$

wherein, $n_e$ is the number of electric fields, and $\alpha_{ESP}$ is the proportion of the resistance of the dry electrostatic precipitator to the total resistance in the first half and is calculated as follows:

$$\alpha_{ESP} = \frac{p_{ESP}}{p_{idf}}$$

power consumption of a wet electrostatic precipitator includes power consumption of induced draft fans, power consumption of power supplies, a power cost and a material cost, and the power consumption of induced draft fans of the wet electrostatic precipitator is calculated as follows:

$$COST_{WESP\_idf} = \frac{1}{q} \times \sqrt{3} \cos\varphi \left(\sum_{i=1}^{n_{idf}} I_i U_i\right) \times P_E \times \alpha_{WESP}$$

$$\alpha_{WESP} = \frac{p_{WESP}}{p_{idf}}$$

the power consumption of power supplies of the wet electrostatic precipitator is:

$$COST_{WESP\_e} = \frac{1}{q} \times \sqrt{3} \cos\varphi \left(\sum_{i=1}^{n_e} I_i U_i\right) \times P_E$$

the power cost is calculated as follows:

$$COST_{wc} = \frac{1}{q} \times \sqrt{3} \cos\varphi \left(\sum_{i=1}^{n_{wc}} I_i U_i\right) \times P_E$$

the material cost of the wet electrostatic precipitator includes a process water cost and an alkali consumption cost, which are calculated as follows:

$$COST_{WESP\_w} = \frac{1}{q} \times w \times P_w$$

$$COST_{Na} = \frac{1}{q} \times Na \times P_{Na}$$

the fixed costs of the dry electrostatic precipitation system and the wet electrostatic precipitation system include depreciation costs $COST_{ESP\_d}$ and $COST_{WESP\_d}$, repair costs $COST_{ESP\_r}$ and $COST_{WESP\_r}$, and manual costs $COST_{ESP\_m}$ and $COST_{WESP\_m}$, which are respectively calculated as follows:

$$COST_{ESP\_d} = \frac{1}{Q \times H} \times \frac{P_{WESP\_init} \times \eta_{ESP}}{Y_{ESP}}$$

$$COST_{WESP\_d} = \frac{1}{Q \times H} \times \frac{P_{WESP\_init} \times \eta_{WESP}}{Y_{WESP}}$$

$$COST_{ESP\_r} = \frac{1}{Q \times H} \times P_{ESP\_init} \times \eta_{ESP\_r}$$

$$COST_{WESP\_r} = \frac{1}{Q \times H} \times P_{WESP\_init} \times \eta_{WESP\_r}$$

$$COST_{ESP\_m} = \frac{1}{Q \times H} \times \sum_{i=1}^{n_{esp}} S_{ESP_i}$$

$$COST_{WESP\_m} = \frac{1}{Q \times H} \times \sum_{i=1}^{n_{WESP}} S_{WESP_i}$$

wherein, $P_{ESP\_init}$ and $P_{WESP\_init}$ respectively represent initial investment costs of the dry electrostatic precipitation system and the wet electrostatic precipitation system, $\eta_{ESP}$ and $\eta_{WESP}$ respectively represent fixed assets formation rates of the dry electrostatic precipitation system and the wet electrostatic precipitation system, $Y_{ESP}$ and $Y_{WESP}$ respectively represent a depreciable life of the dry electrostatic precipitation system and a depreciable life of the wet electrostatic precipitation system, $\eta_{ESP\_r}$ and $\eta_{WESP\_r}$ respectively represent the ratio of the repair cost of the dry electrostatic precipitation system to the investment cost and the ratio of the respectively represent the total number of workers of the dry electrostatic precipitation system, and $S_{ESP_i}$ and $S_{WESP_i}$ respectively represent the annual salary of an $i^{th}$ worker of the dry electrostatic precipitation system.

2. The method according to claim 1, wherein based on modeling of the multi-device multi-pollutant simultaneous removal process and global operating cost evaluation, the multi-pollutant, multi-target and multi-condition global operating optimization method is applied to a computer-implemented multi-pollutant emission system constituted by a selective catalytic reduction (SCR) denitration system, a dry electrostatic precipitation system, a wet flue gas desulphurization system and a wet electrostatic precipitation system to realize minute-level planning and optimization of emission reductions of a global pollutant emission reduction device under different emission targets through sub-disciplinary decomposition of different pollutants and global and local swarm intelligence algorithms by means of a simultaneous removal effect of the devices on the pollutants and a mutual inter-coupling and competition relationship of the pollutants.

3. The method according to claim 2, wherein a disperse policy decision method based on a collaborative optimization algorithm is used as a solution to multi-model optimization of the operation of the complicated intelligent multi-pollutant ultra-low emission system;

according to the collaborative optimization algorithm, expected values of coupling variables are transmitted from a system level to discipline levels at first, and under the condition of meeting corresponding constraints, the discipline levels are separately optimized to make optimization results closest to the expected values provided by the system level; then, the optimization results are transmitted to the system level; after receiving the optimization results of the discipline levels, the system level coordinates the coupling variables and generates new expected values of the coupling variables; the new expected values are transmitted to the discipline levels again; a feasible solution that makes the coupling variables consistent and meets optimization targets is finally obtained through repeated iterations between the system level and the discipline levels.

4. The method according to claim 2, wherein according to the advanced control method for reliable up-to-standard ultra-low emission of the pollutants, dynamic property response models of manipulated variables and disturbance parameters of pollutant removal devices to pollutant removal are established based on real-time data, and under the condition of set emission reduction values of the devices for global optimization, control variables of the pollutant removal devices are optimized and controlled in real time through a model prediction and control method; the dynamic property response models are updated online to better adapt to large-delay, non-linearity and variable-load characteristics of the system, and even if system parameters change, margin control of pollutant emission can be realized, and pollutant removal costs are further reduced when the system varies.

5. The method according to claim 4, wherein nine pollutant-removal dynamic property response models for load increase, load decrease and load maintaining under predetermined high, medium and small load conditions are established, and in different load change stages, different dynamic property response models are used to calculate control variables of the pollutant removal devices to better conform to actual changes of the system; online updating of the models refer to parameter substitutions of the models every a certain period of time in case of not meeting dynamic response properties, and the period of time varies according to different properties of the desulfurization system, the denitration system and the precipitation system; the model of the denitration system is updated every one hour, the model of the desulfurization system is updated every one day, and the model of the precipitation system is updated every ten minutes.

* * * * *